(12) United States Patent
Tsai et al.

(10) Patent No.: US 12,543,553 B2
(45) Date of Patent: Feb. 3, 2026

(54) FORMING LINERS TO FACILITATE THE FORMATION OF COPPER-CONTAINING VIAS IN ADVANCED TECHNOLOGY NODES

(71) Applicant: Taiwan Semiconductor Manufacturing Company, Ltd., Hsinchu (TW)

(72) Inventors: Chen-Hung Tsai, Hsinchu (TW); Chao-Hsun Wang, Taoyuan County (TW); Pei-Hsuan Lee, Taipei (TW); Chih-Chien Chi, Hsinchu (TW); Ting-Kui Chang, New Taipei (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 610 days.

(21) Appl. No.: 17/466,425

(22) Filed: Sep. 3, 2021

(65) Prior Publication Data

US 2022/0336367 A1    Oct. 20, 2022

Related U.S. Application Data

(60) Provisional application No. 63/175,119, filed on Apr. 15, 2021.

(51) Int. Cl.
| | |
|---|---|
| *H01L 23/532* | (2006.01) |
| *H01L 21/768* | (2006.01) |
| *H10D 64/23* | (2025.01) |

(52) U.S. Cl.
CPC .. *H01L 23/53238* (2013.01); *H01L 21/76802* (2013.01); *H01L 21/76846* (2013.01); *H01L 21/76877* (2013.01); *H10D 64/258* (2025.01)

(58) Field of Classification Search
CPC .......... H01L 23/53238; H01L 23/5226; H01L 21/76877; H01L 29/41791; H01L 29/785; H01L 29/41775; H10D 64/258
See application file for complete search history.

(56) References Cited

U.S. PATENT DOCUMENTS

| | | | |
|---|---|---|---|
| 6,258,707 B1 * | 7/2001 | Uzoh | ................ H01L 21/76877 257/E21.585 |
| 7,667,271 B2 | 2/2010 | Yu et al. | |
| 7,902,581 B2 * | 3/2011 | Frohberg | .......... H01L 21/76877 438/618 |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |

(Continued)

*Primary Examiner* — Bac H Au
(74) *Attorney, Agent, or Firm* — HAYNES AND BOONE, LLP

(57) ABSTRACT

A semiconductor device includes a source/drain component of a transistor. A source/drain contact is disposed over the source/drain component. A source/drain via is disposed over the source/drain contact. The source/drain via contains copper. A first liner at least partially surrounds the source/drain via. A second liner at least partially surrounds the first liner. The first liner and the second liner are disposed between the source/drain contact and the source/drain via. The first liner and the second liner have different material compositions.

20 Claims, 24 Drawing Sheets

(56) References Cited

U.S. PATENT DOCUMENTS

| | | | |
|---|---|---|---|
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,836,129 | B1 * | 9/2014 | Hung ............... H01L 23/5384 438/618 |
| 8,860,148 | B2 | 10/2014 | Hu et al. |
| 10,510,596 | B2 * | 12/2019 | Tsai ................ H01L 29/4966 |
| 2007/0257323 | A1 * | 11/2007 | Tsui ................ H01L 23/485 257/382 |
| 2008/0099921 | A1 * | 5/2008 | Katata ............ H01L 23/53238 438/653 |
| 2011/0062502 | A1 * | 3/2011 | Yin ................ H01L 29/66545 257/E21.409 |
| 2012/0043592 | A1 * | 2/2012 | Zhao ................ H01L 29/78 438/653 |
| 2014/0001574 | A1 | 1/2014 | Chen et al. |
| 2014/0110755 | A1 | 4/2014 | Colinge |
| 2014/0151812 | A1 | 6/2014 | Liaw |
| 2015/0380305 | A1 * | 12/2015 | Basker ............. H01L 21/845 257/77 |
| 2016/0071800 | A1 * | 3/2016 | Hung ............. H01L 21/76855 257/288 |
| 2017/0243947 | A1 * | 8/2017 | Adusumilli ........ H01L 29/45 |
| 2017/0278747 | A1 * | 9/2017 | Adusumilli ..... H01L 21/76897 |
| 2019/0006515 | A1 * | 1/2019 | Cheng ................ H10D 30/62 |
| 2019/0115256 | A1 * | 4/2019 | Wang ............. H01L 21/76877 |
| 2019/0333820 | A1 * | 10/2019 | Chang ........... H01L 21/76843 |
| 2020/0126857 | A1 * | 4/2020 | Tsai ................ H01L 29/6653 |
| 2020/0312994 | A1 * | 10/2020 | You .................. H01L 29/401 |
| 2020/0350312 | A1 * | 11/2020 | Jun ................ H01L 21/76224 |
| 2021/0091190 | A1 * | 3/2021 | Huang ............ H01L 21/28562 |
| 2022/0223517 | A1 * | 7/2022 | Wang .............. H01L 23/5283 |

\* cited by examiner

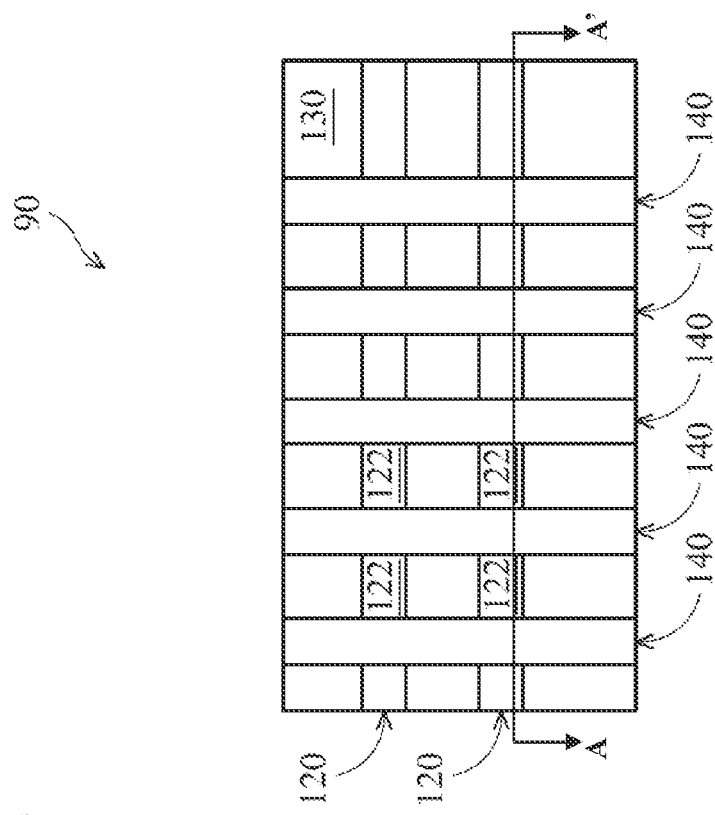
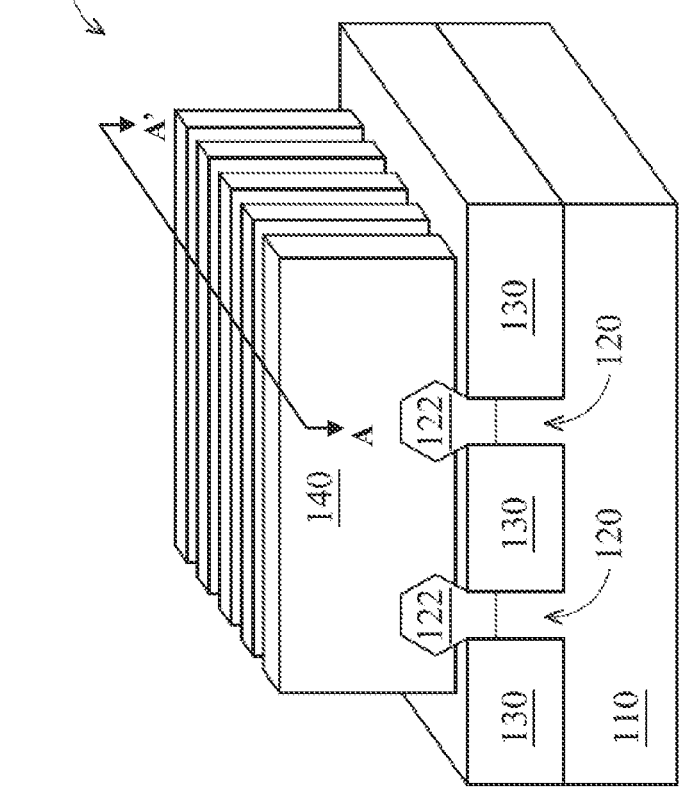
Fig. 1B
Fig. 1A

FORMING LINERS TO FACILITATE THE FORMATION OF COPPER-CONTAINING VIAS IN ADVANCED TECHNOLOGY NODES

PRIORITY DATA

The present application is a utility U.S. Patent Application of provisional U.S. Patent Application No. 63/175,119, filed on Apr. 15, 2021, entitled "Conductive Contact Plug and Method of Fabrication Thereof", the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the sizes of the transistor components continue to get smaller, gap filling becomes more challenging, which could adversely affect the formation of conductive vias. As a result, conductive vias formed using conventional processes may have voids or gaps trapped therein and/or have greater-than-desired resistance. Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

DETAILED DESCRIPTION

Figure 1C:
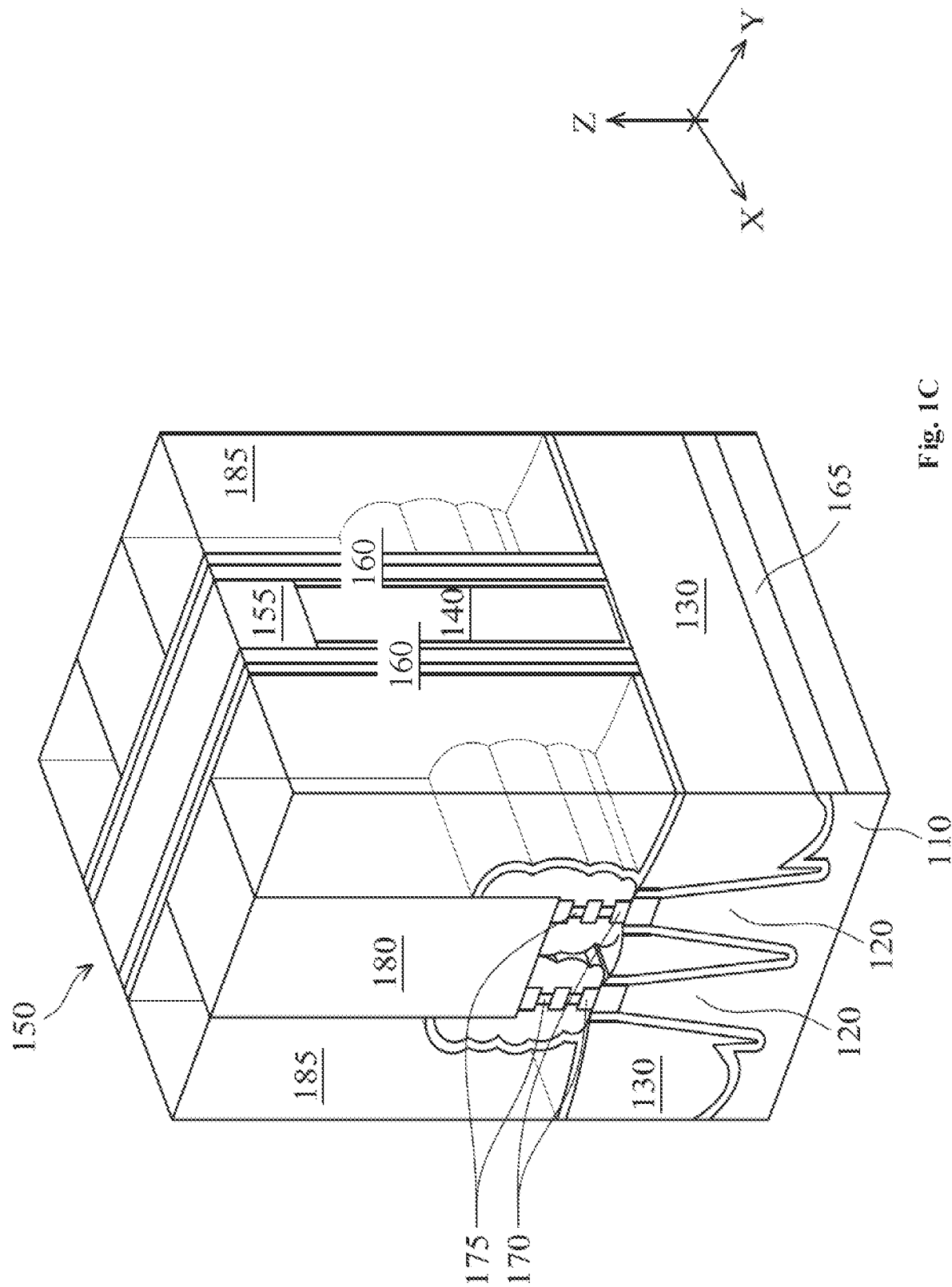
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors.

However, as semiconductor device sizes continue to get scaled down, conventional methods of fabricating FinFETs or GAA devices may not be optimized. For example, in order to provide electrical connectivity to the various components of a transistor, via holes may be etched through one or more dielectric layers, and a conductive material may be deposited to fill the via holes to form conductive source/drain vias or gate vias. Unfortunately, as the transistor components become small, the dimensions of the via holes shrink as well, which makes it more difficult to fill the via holes without trapping gaps or void therein. The trapped gaps or voids within the vias degrade the performance of the transistor, for example, by increasing the resistance of the via. Furthermore, certain conductive materials (e.g., copper) may have good electrical characteristics such as low resistivity that otherwise make them good candidates as vias, but they may have poor gap filling performance. As such, certain conventional fabrication processes may choose to fill the via holes with non-copper materials that have better gap filling performance, even though the electrical characteristics of these materials may be suboptimal (e.g., having a greater resistivity than copper). In other words, conductive vias formed by conventional fabrication processes may either have gaps or voids trapped therein, and/or may have greater-than-desired resistance. As a result, device performance and/or yield may be degraded.

To address the problem discussed above, the present disclosure implements a unique fabrication process flow to form conductive vias that have good electrical characteristics without trapping gaps or voids therein. In some embodiments, one or more liner layers may be formed within the via holes, and a copper-containing material may be deposited onto the liner layers to fill the via holes, followed by a thermal baking process. The liner layers facilitate a reflow of the copper-containing material during the thermal baking process, thereby reducing or eliminating the gaps or voids in the reflowed copper-containing material filling the via holes. Consequently, the conductive vias formed by the unique processes of the present disclosure may simultaneously achieve good gap filling as well as improved electrical performance (e.g., low resistivity).

Figure 21:
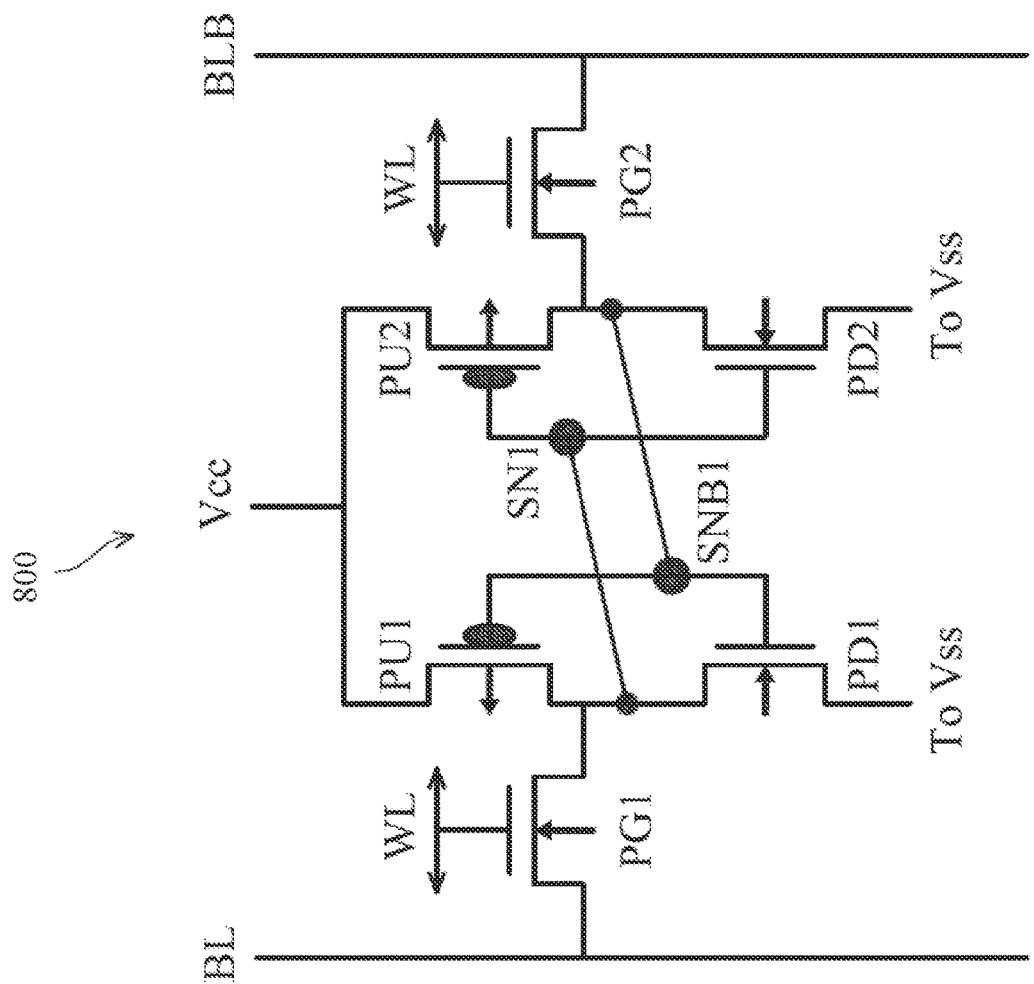
FIG. 21 illustrates a Static Random Access Memory (SRAM) cell according to various aspects of the present disclosure.
Figure 22:
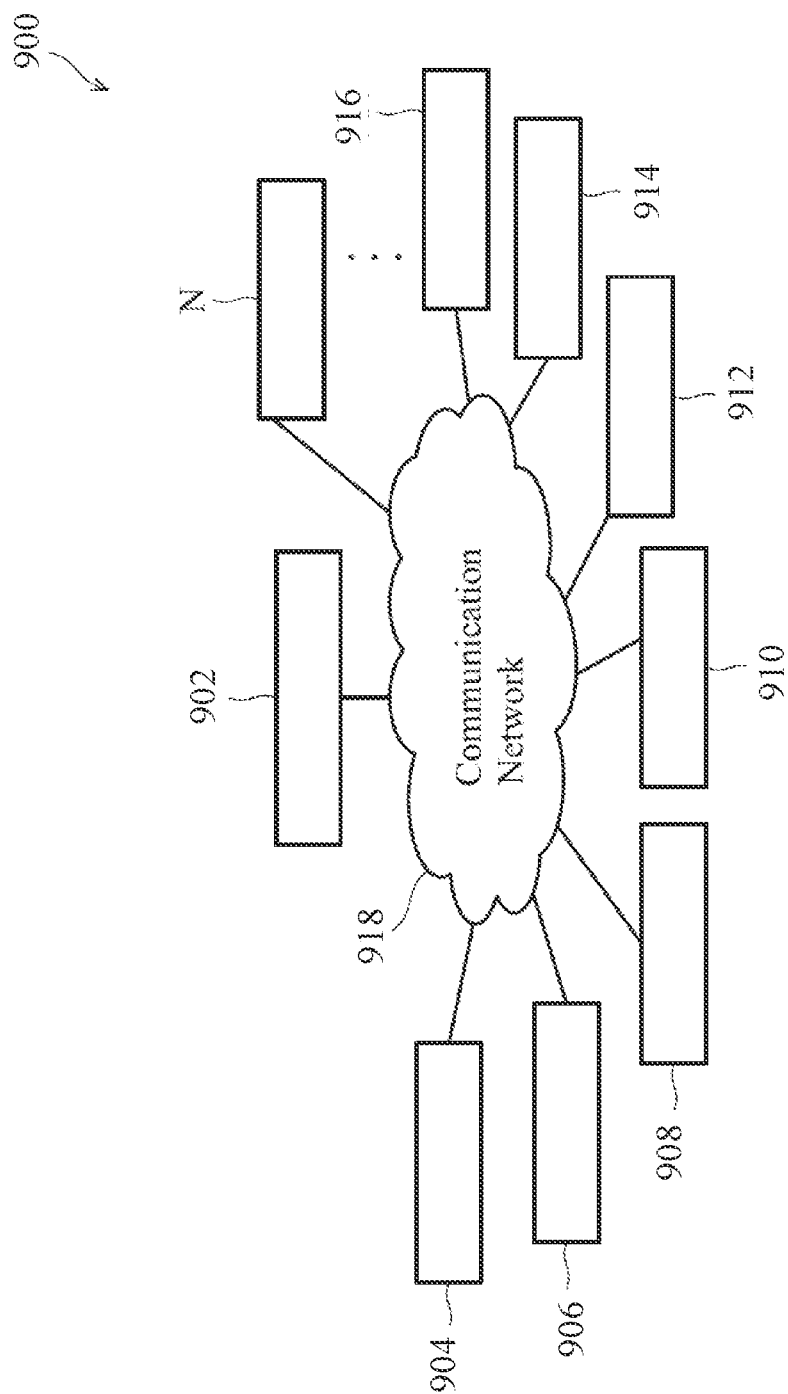
FIG. 22 illustrates an integrated circuit fabrication system according to various aspects of the present disclosure.
Figure 23:
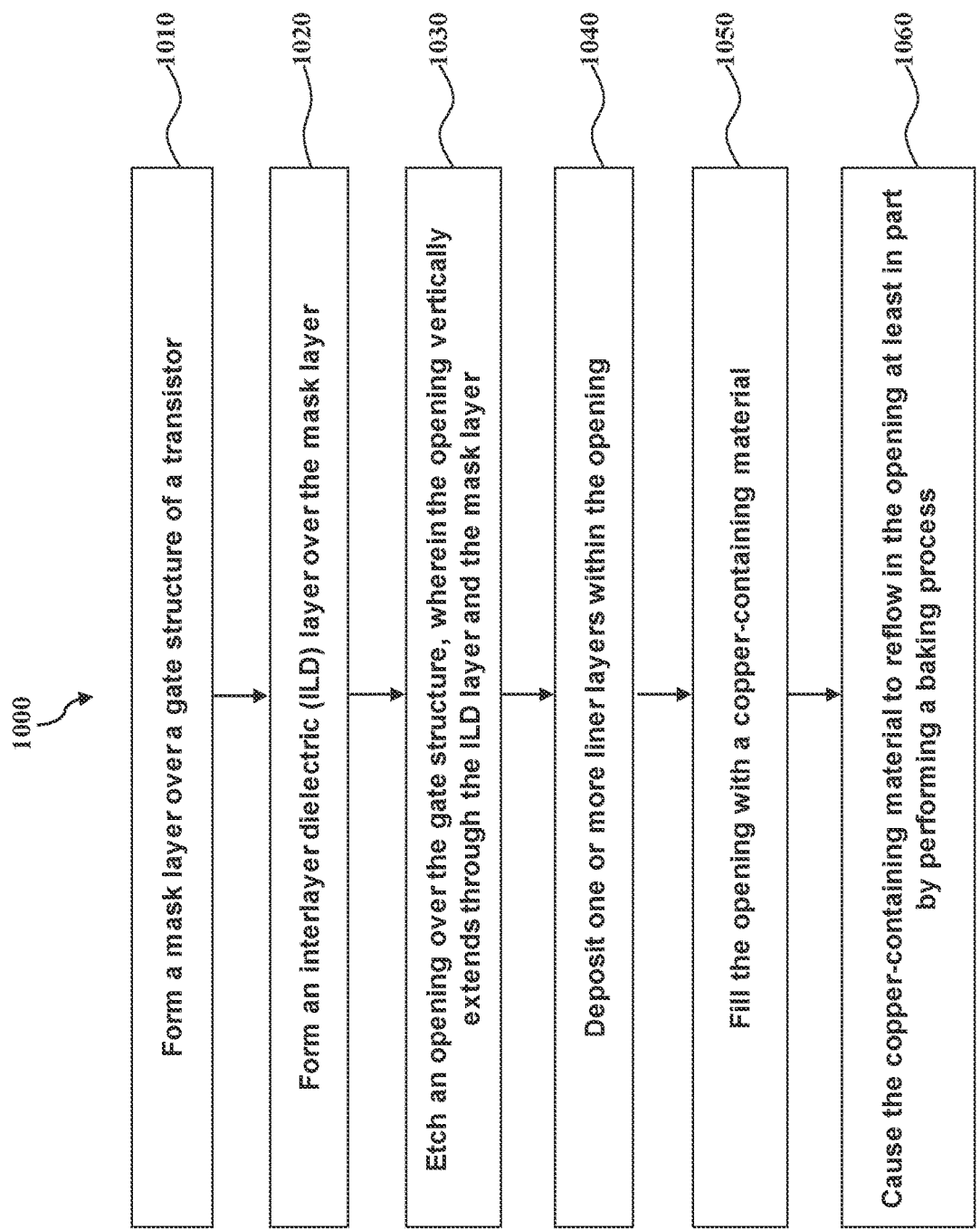
FIG. 23 is a flowchart illustrating a method of fabricating a semiconductor device according to various aspects of the present disclosure.

The various aspects of the present disclosure will now be discussed below with reference to FIGS. 1A-1C and 2-23. In more detail, FIGS. 1A-B illustrate an example FinFET device, and FIG. 1C illustrates an example GAA device. FIGS. 2-20 illustrate cross-sectional side views of an IC device at various stages of fabrication according to embodiments of the present disclosure. FIG. 21 illustrates a memory circuit as an example IC application implemented using IC devices fabricated according to the various aspects of the present disclosure. FIG. 22 illustrates a semiconductor fabrication system. FIG. 23 each illustrate a flowchart of a method of fabricating an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structures such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-20 illustrate diagrammatic fragmentary cross-sectional views of a portion of the IC device 200 at various stages of fabrication according to various embodiments of the present disclosure. Since FIGS. 2-20 illustrate the cross-sectional views along a X-Z plane, and as such, FIGS. 2-20 may be referred to as X-cuts. For example, the cross-sectional side views of the IC device in FIGS. 2-20 may be obtained by taking a cross-sectional cut along the cutline A-A' shown in FIGS. 1A-1B. For reasons of simplicity and consistency, similar components appearing in FIGS. 1A-1C will be labeled the same in FIGS. 2-20. It is also understood that although the discussions below primarily use a FinFET (e.g., the FinFET of FIGS. 1A-1B) to illustrate the inventive concepts of the present disclosure, the same concepts may apply to the GAA device (e.g., the GAA device of FIG. 1C) as well, unless otherwise noted.

Figure 2:
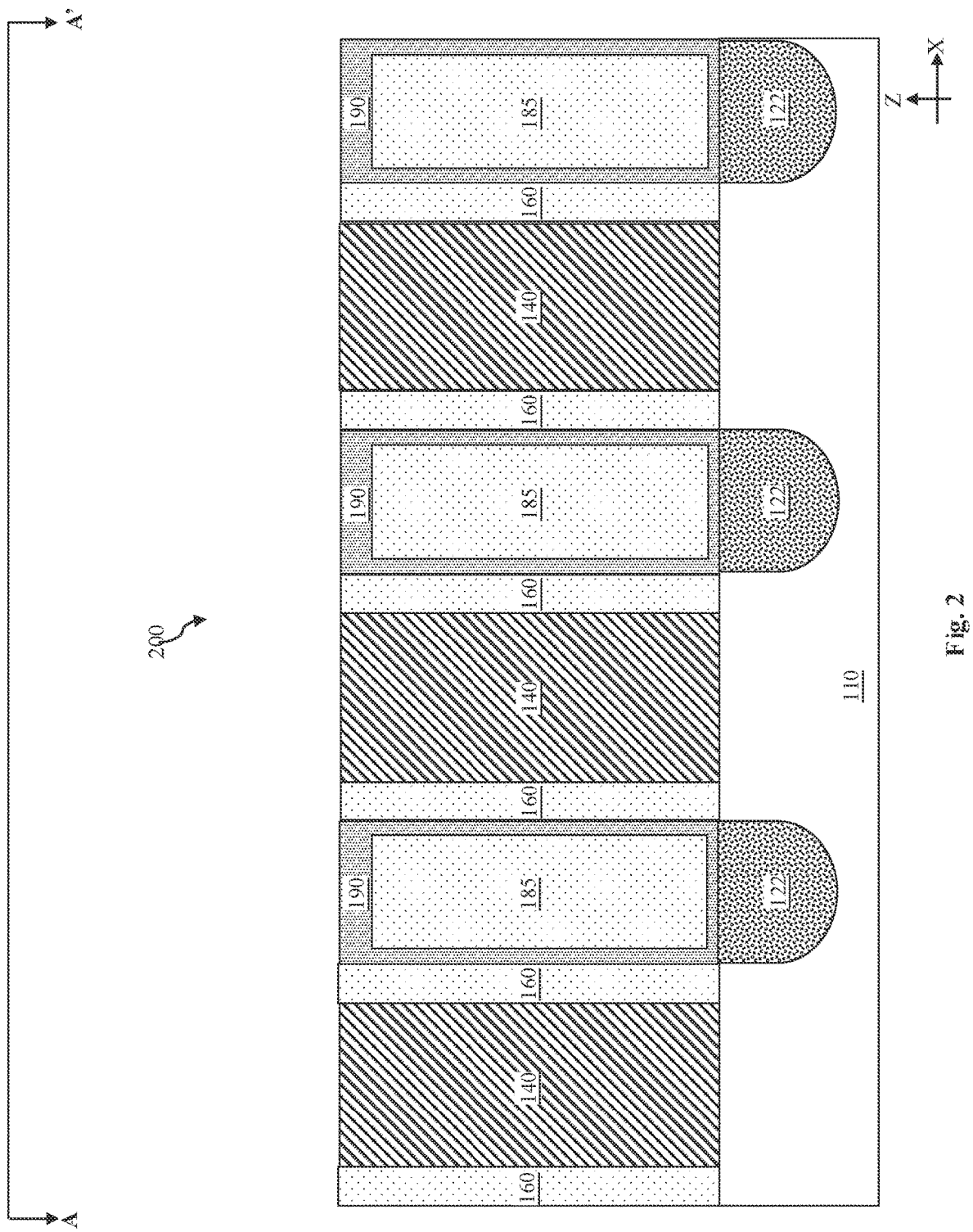
FIGS. 2-20 illustrate a series of cross-sectional views of a semiconductor device at various stages of fabrication according to embodiments of the present disclosure.

As shown in FIG. 2, the IC device 200 includes the substrate 110 discussed above with reference to FIGS. 1A-1C, for example a silicon substrate. A plurality of active regions may be formed by patterning the substrate 110. For example, the active regions may include the fin structures 120 discussed above with reference to FIGS. 1A-1B. Source/drain components 122 are formed over the fin structures 120. In some embodiments, the source/drain components 122 may include epi-layers that are epitaxially grown on the fin structures.

The IC device 200 further includes a plurality of high-k metal gate (HKMG) structures 140. Each of the HKMG structures 140 may include a high-k gate dielectric and a metal-containing gate electrode. The high-k gate dielectric contains a high-k dielectric material, which refers to a dielectric material having a dielectric constant that is greater than a dielectric constant of silicon oxide (e.g., which is about 3.9). Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode is formed over the high-k gate dielectric. The metal-containing gate electrode may include one or more work function (WF) metal layers and a fill metal layer. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as the main conductive portion of the metal-containing gate electrode. In some embodiments, the fill metal layer may include cobalt, tungsten, copper, aluminum, or alloys or combinations thereof. It is understood that each of the HKMG structures may include additional layers, such as interfacial layers, capping layers, diffusion/barrier layers, or other applicable layers.

In some embodiments, each of the HKMG structures 140 is formed as a part of a gate replacement process, in which a dummy gate structure is formed first and subsequently replaced by the HKMG structure. In that regard, the initially-formed dummy gate structure may include a dummy gate dielectric (e.g., a silicon oxide gate dielectric) and a dummy polysilicon gate electrode. Gate spacers 160 and the ILD 185 may be formed around the dummy gate structures. Note that in some embodiments, such as in the illustrated embodiment, the ILD 185 may be surrounded by a dielectric layer 190, which may contain silicon nitride in some embodiments. The gate spacers 160 (e.g., containing a dielectric material such as silicon nitride or silicon oxide) may be formed on the sidewalls of the dummy gate structures, and the ILD 185 may be formed around the gate spacers 160. After the formation of source/drain components 122, the dummy gate structures are removed (e.g., via one or more etching processes), thereby forming openings or recesses defined at least in part by the gate spacers 160. The HKMG structures 140 are then formed in the openings to replace the removed dummy gate structures. A planarization process, such as a chemical mechanical planarization (CMP) process, may then be performed to remove excess portions of the HKMG structures 140 and planarize the upper surfaces of the HKMG structures 140 with the upper surfaces of the dielectric layer 190.

Figure 3:
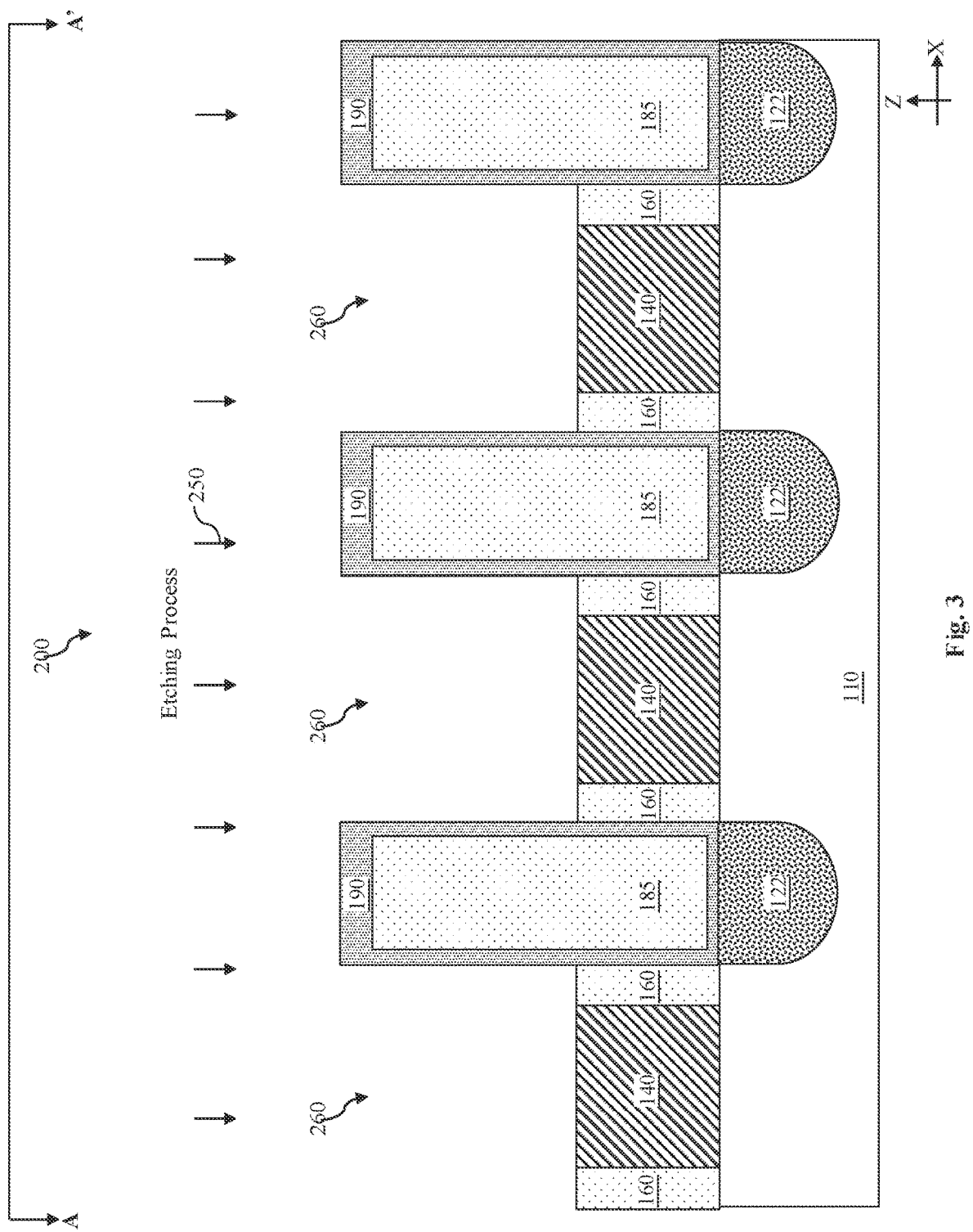

Referring now to FIG. 3, an etching process 250 is performed to the IC device 200 to partially remove the HKMG structures 140 and the gate spacers 160. The etching process 250 is configured to have an etching selectivity between the dielectric layer 190 and the HKMG structures 140 and the gate spacers 160. For example, the etchants and/or other etching parameters of the etching process 250 is configured to etch away the HKMG structures 140 and the gate spacers 160 at a substantially greater or faster rate than the dielectric layer 190. As such, the etching process 250 may etch away portions of the HKMG structures 140 and the gate spacers 160 without substantially affecting the dielectric layer 190. As a result of the etching process 250 being performed, recesses 260 are formed.

Figure 4:
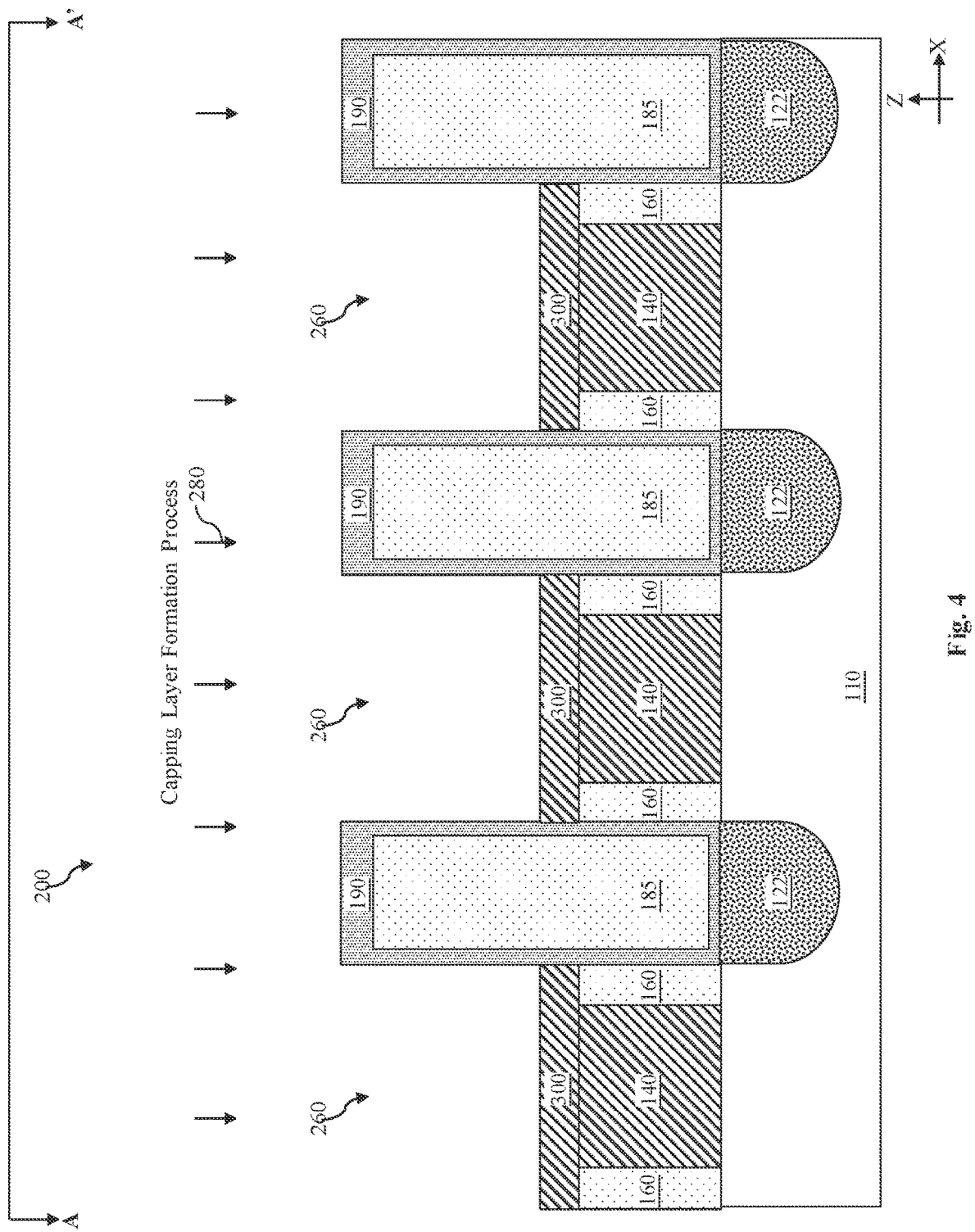

Referring now to FIG. 4, a capping layer formation process 280 is performed to form a capping layer 300 over the upper surfaces of the remaining portions of the HKMG structures 140 and the gate spacers 160. In some embodiments, the capping layer formation process 280 includes a bottom-up formation process (which is different from a conventional deposition process such as chemical vapor deposition (CVD), physical vapor deposition (PVD), or atomic layer deposition (ALD)), in which a metal-containing precursor is formed on the upper surfaces of the HKMG structures 140. The metal-containing precursor has a greater affinity with respect to the metal materials of the HKMG structures 140 than with the other material (such as the dielectric layer 190). As such, the rest of the capping layer 300 can be formed on the HKMG structures 140 based on the metal-containing precursor. In some embodiments, the metal-containing precursor includes a tungsten precursor, and the capping layer 300 includes a fluorine-free tungsten capping layer. In other embodiments, the metal-containing precursor includes a titanium and/or nitrogen precursor, and the capping layer 300 includes a titanium nitride capping layer.

Unlike a CVD/PVD/ALD process, where the resulting layer would be formed not only on the upper surfaces of the HKMG structures 140, but also on the exposed side and upper surfaces of the dielectric layer 190, the bottom-up process forms the capping layer 300 on the upper surfaces of the HKMG structures 140 (and then extends over the upper surfaces of the gate spacers 160) but not on the upper and side surfaces of the dielectric layer 190, since the capping layer 300 is grown from the bottom side to the up side. Advantageously, no additional processes need to be performed just to remove the excess portions of the capping layer that would be formed on the upper and side surfaces of the dielectric layer 190, since the bottom-up approach of the capping layer formation process 280 does not form these excess portions of the capping layer 300 in the first place. However, it is understood that in alternative embodiments, other deposition processes (such as CVD, PVD, or ALD) may be performed to form the capping layer 300, although the excess portions of the capping layer 300 would have to be removed following the deposition processes.

Regardless of how the capping layer 300 is formed, it will help reduce the diffusion of metal materials from a yet-to-be-formed gate via into the HKMG structures 140 below. In other words, a gate via will be formed over the HKMG structures 140 (as will be discussed in greater detail below). Had the capping layer 300 not been formed, the metal materials from the gate via could diffuse into the metal gate electrodes of the HKMG structures, which would adversely affect the performance of the HKMG structures 140, such as the threshold voltage. Thus, the material composition of the capping layer 300 is configured to block the materials from the gate via from penetrating into the HKMG structures 140. As such, device performance is improved.

Figure 5:
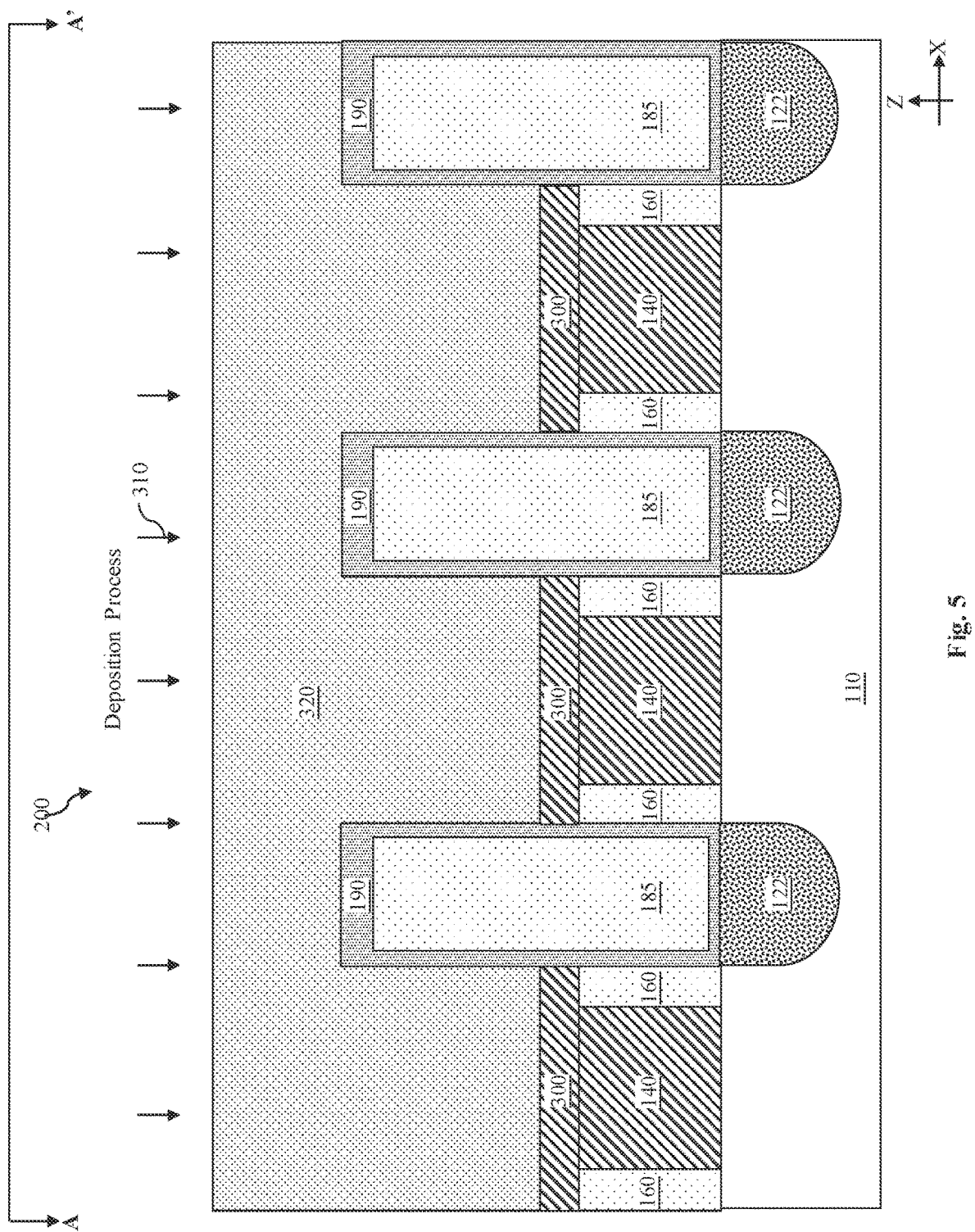

Referring now to FIG. 5, a deposition process 310 is performed to the IC device 200 to form a mask layer 320 over the capping layer 300 and over the dielectric layer 190. In some embodiments, the deposition process 310 includes a CVD process, a PVD process, an ALD process, or combinations thereof. The mask layer 320 may include a dielectric material, for example, silicon nitride.

Figure 6:
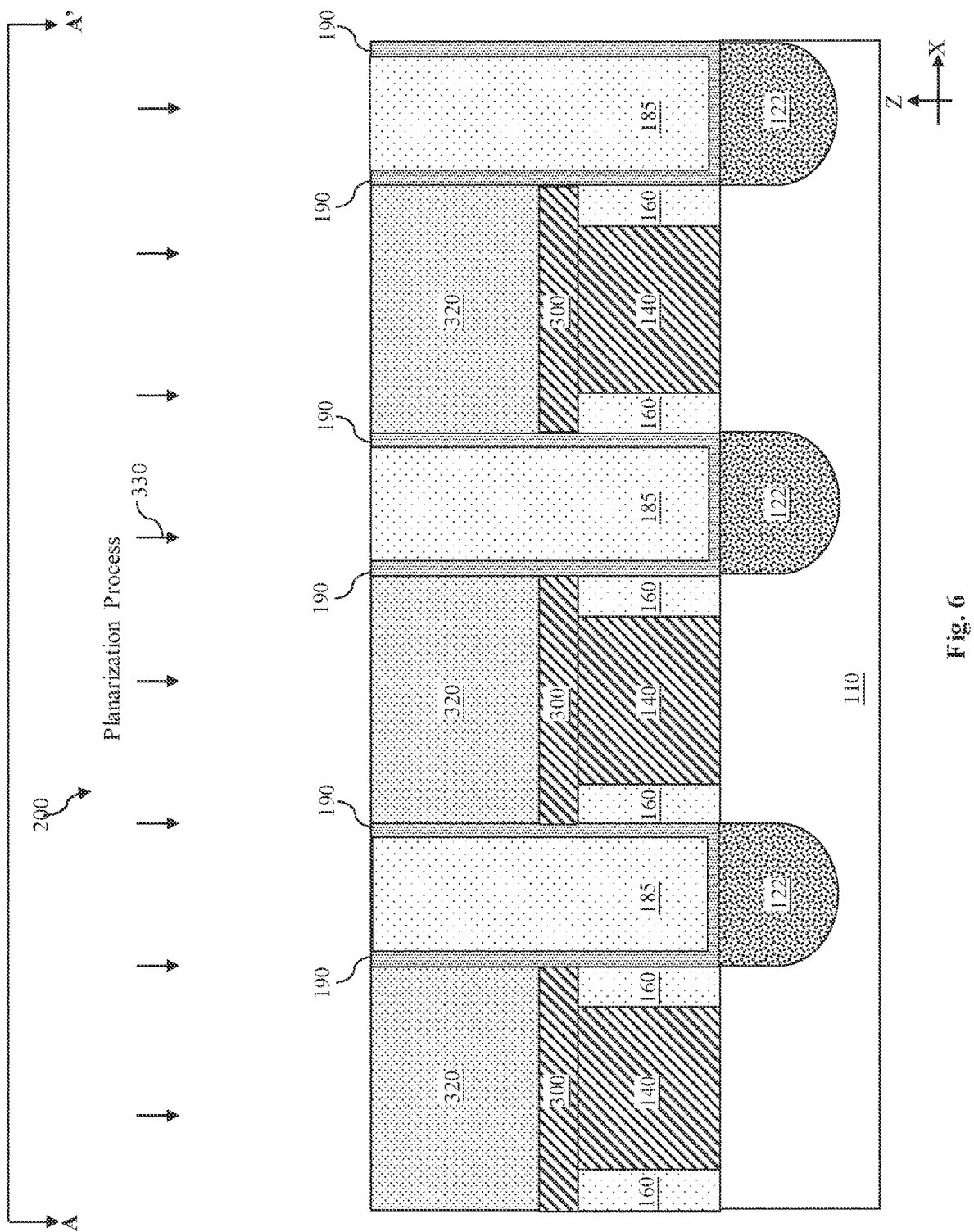

Referring now to FIG. 6, a planarization process 330 is performed to partially remove the mask layer 320 and the dielectric layer 190. In some embodiments, the planarization process 330 includes a CMP process. The CMP process may grind away and/or polish the mask layer 320 and the dielectric layer 190 until the upper surfaces of the ILD 185 are exposed. After the performance of the planarization process 330, the upper surfaces of the remaining portions of the mask layer 320 and the dielectric layer 190 are substantially co-planar with the upper surfaces of the ILD 185.

Figure 7:
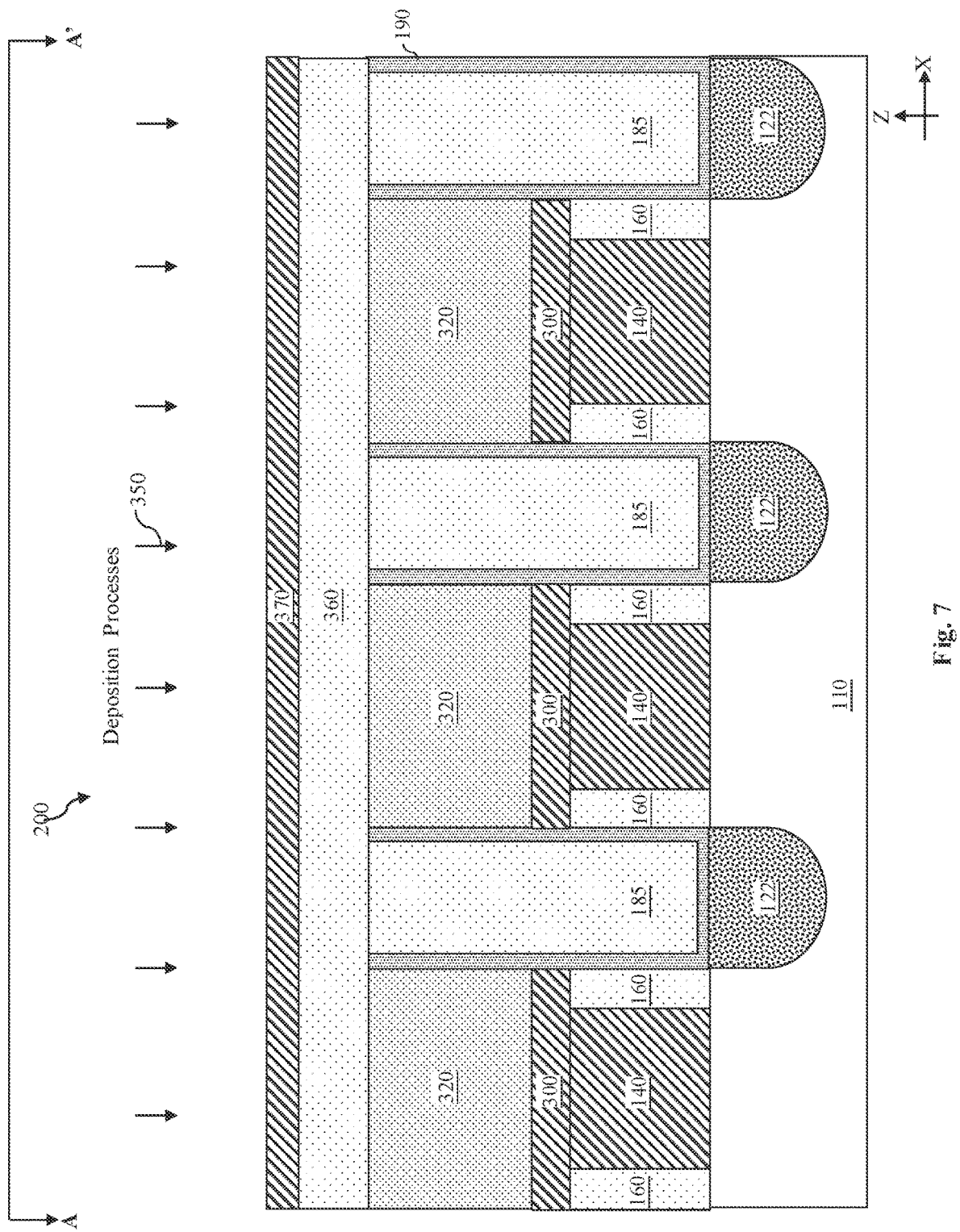

Referring now to FIG. 7, a plurality of deposition processes 350 are performed to the IC device 200 to form an ILD 360 over the planarized upper surfaces of the mask layer 320, the dielectric layer 190, and the ILD 185, and also to form a metal-containing mask layer 370 over the ILD 360. In some embodiments, the deposition processes 350 includes one or more CVD processes, one or more PVD processes, one or more ALD processes, or combinations thereof. In some embodiments, the ILD 360 has a same or substantially similar material composition as the ILD 185. In some embodiments, the metal-containing mask layer 370 includes tungsten carbide.

Figure 8:
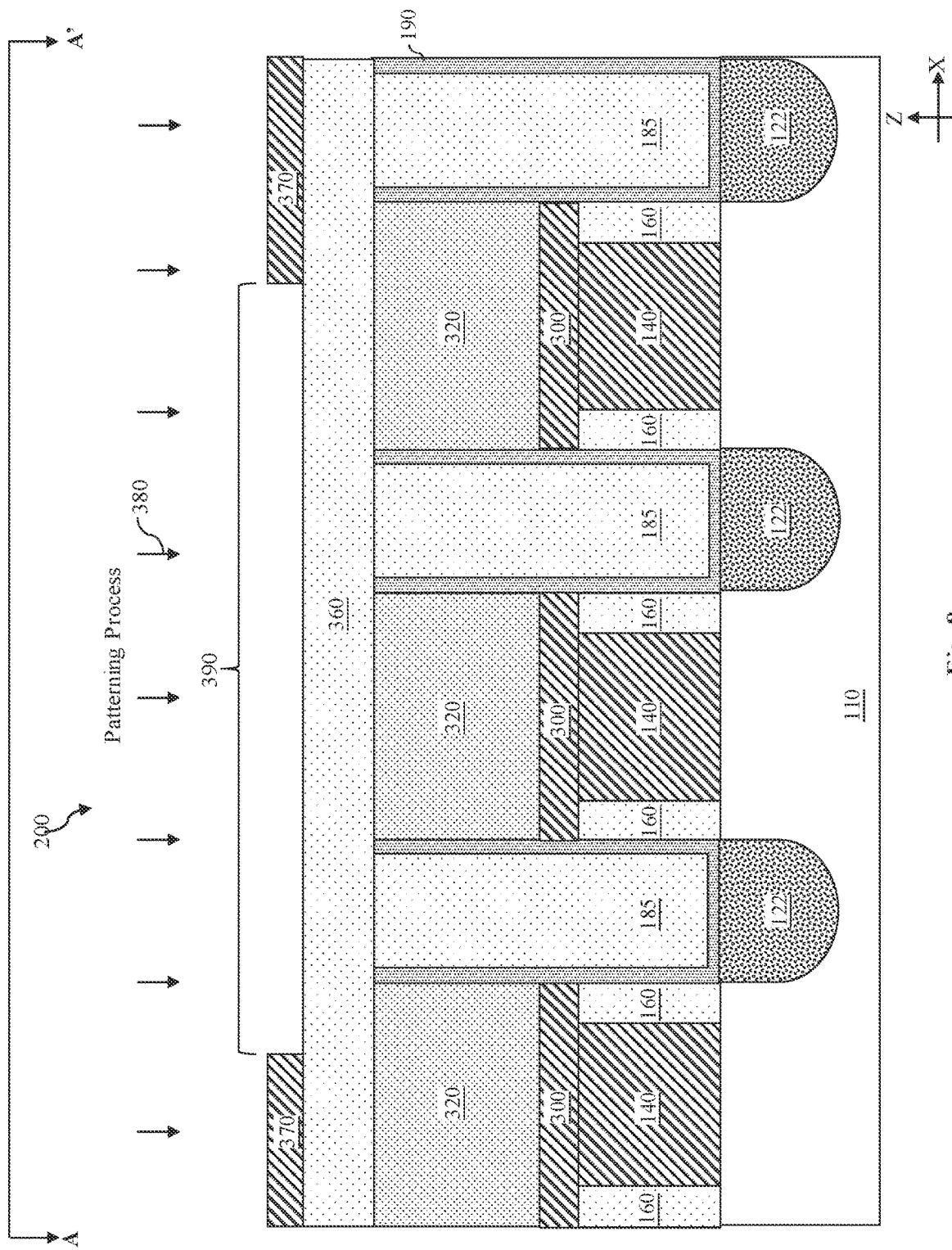

Referring now to FIG. 8, a patterning process 380 is performed to the IC device 200 to pattern the metal-containing mask layer 370. The patterning process 380 may include spin-coating a photoresist material on the metal-containing mask layer 370, and thereafter performing one or more lithography processes such as exposing, post-exposure baking, developing, rinsing, etc., in order to form a patterned photoresist layer. The patterned photoresist layer is then used to pattern the metal-containing mask layer 370. The patterned photoresist layer may then be removed (e.g., using a photoresist stripping or ashing process) after the metal-containing mask layer 370 has been patterned. As a result of the patterning process 380 being performed, the patterned metal-containing mask layer 370 defines an opening 390. The opening 390 laterally (in the X-direction) spans over the leftmost and the middle source/drain components 122 shown in FIG. 8, but not the rightmost source/drain component 122.

Figure 9:
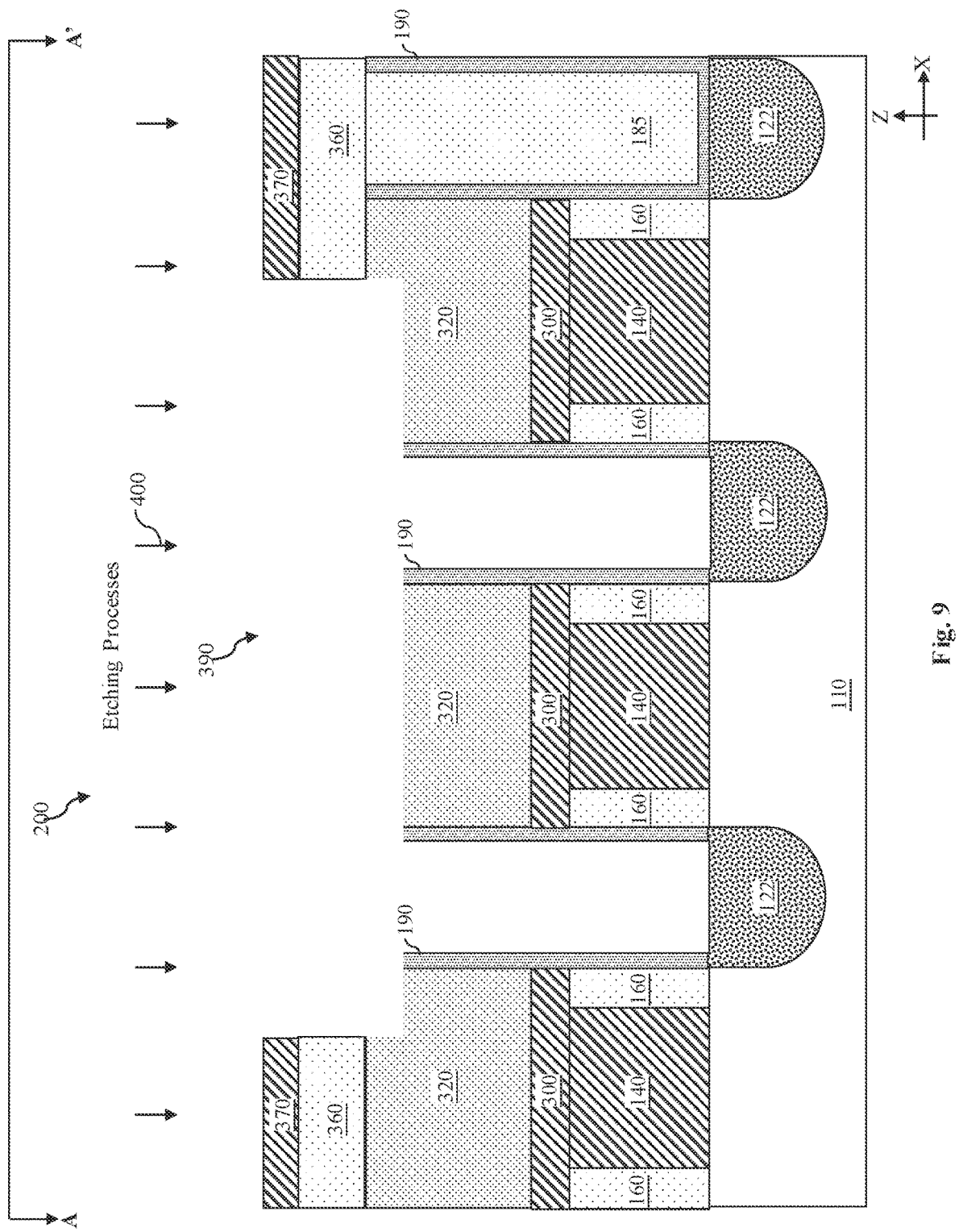

Referring now to FIG. 9, one or more etching processes 400 are performed to the IC device 200 to extend the opening 390 vertically downward (in the Z-direction). In more detail, the portions of the ILD 185 and ILD 360 that are not protected by the patterned metal-containing mask layer 370 are etched away, and the portions of the mask layer 320 and the dielectric layer 190 are partially etched away, such that the upper surfaces of the source/drain components 122 are exposed by the opening 390. In some embodiments, the etching processes 400 may include a first etching process to etch away the ILD 185 and ILD 360, followed by a second etching process to etch away portions of the dielectric layer 190 that cover the upper surfaces of the source/drain components 122.

Figure 10:
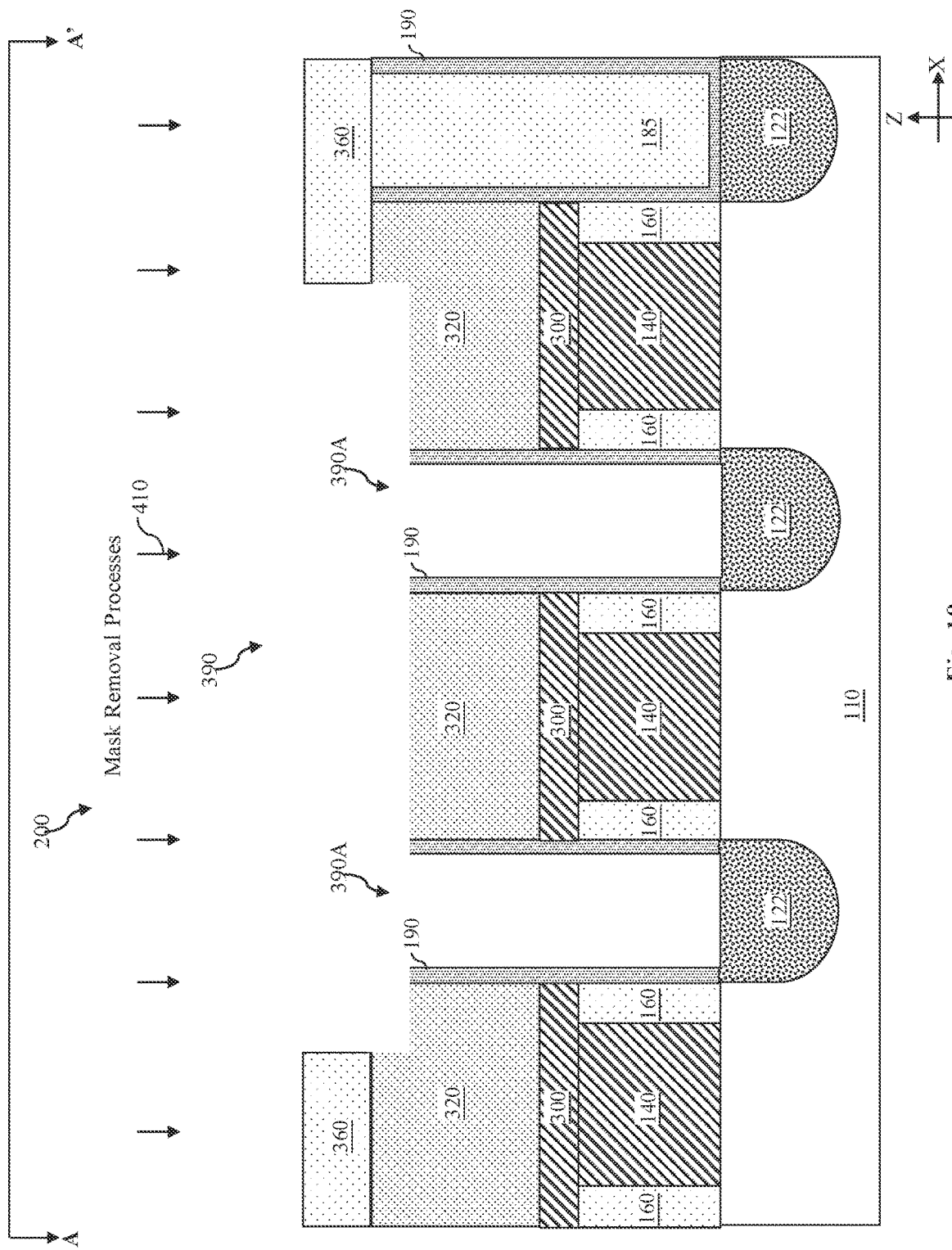

Referring now to FIG. 10, a mask removal process 410 is performed to the IC device 200 to remove the patterned metal-containing mask layer 370. In some embodiments, the mask removal process 410 may include one or more etching processes that are configured to have an etching selectivity between the material of the metal-containing mask layer 370 and the rest of the materials of the IC device 200. For example, the etching selectivity ensures that the metal-containing mask layer 370 can be etched away at a substantially faster rate than the rest of the materials of the IC device 200, so that the metal-containing mask layer 370 is removed without substantially affecting the rest of the IC device 200. As shown in FIG. 10, the downward extension of the opening 390 forms source/drain contact holes 390A as parts of the opening 390.

Figure 11:
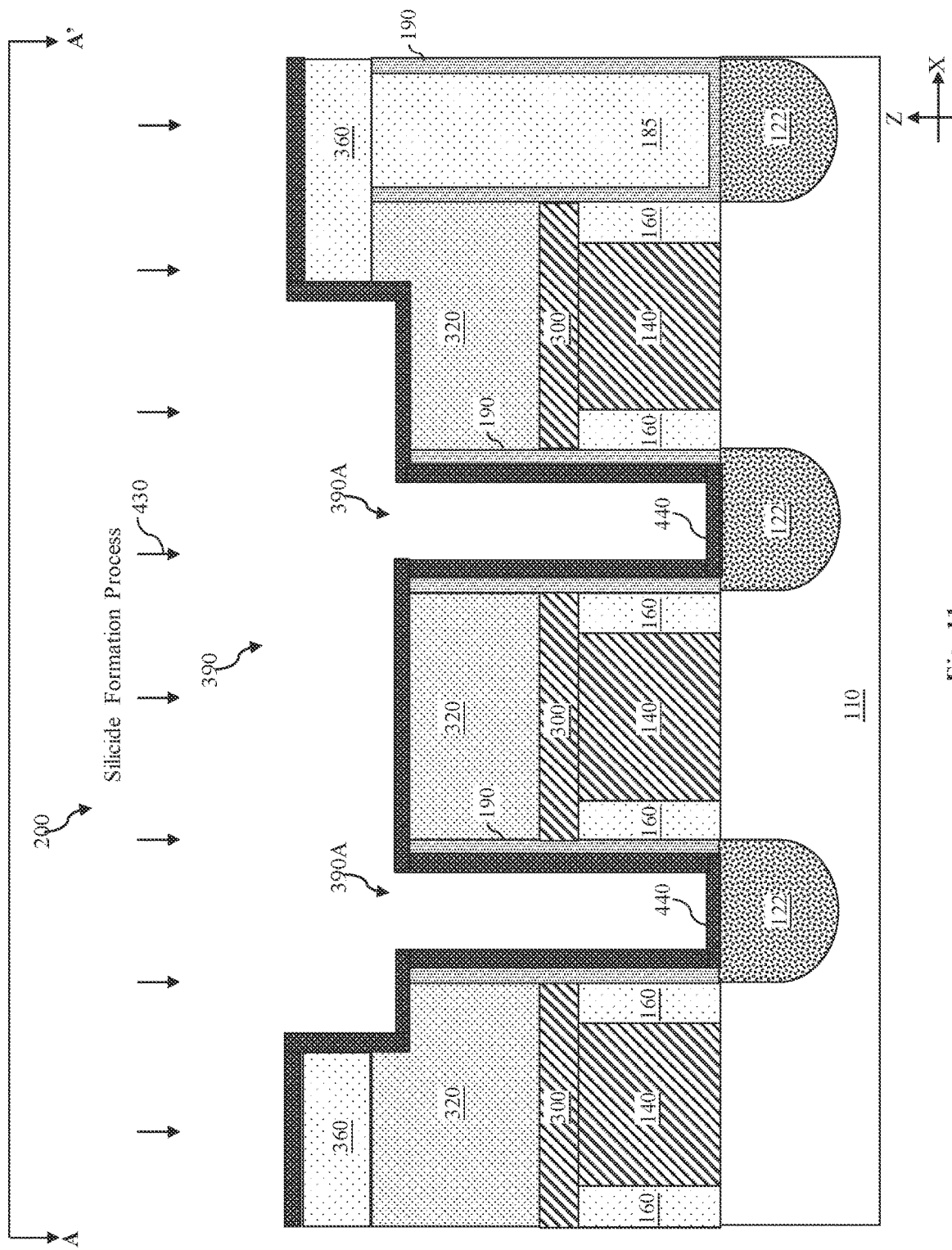

Referring now to FIG. 11, a silicide formation process 430 is performed to the IC device 200 to form silicide layers 440. The silicide formation process 430 may include a deposition step, in which a conductive material, such as Ti, is deposited onto the exposed upper surfaces of the source/drain components 122, as well as onto the exposed upper and/or side surfaces of the ILD 360, the mask layer 320, and the dielectric layer 190. The silicide formation process 430 may further include an annealing step, in which the deposited conductive material is annealed at a high temperature of a few hundred degrees Celsius. Portions of the deposited material interfacing with the source/drain components 122 may be transformed into the silicide layers. In some embodiments, the silicide layer 440 include titanium silicide (TiSi), which offers the benefit of low resistivity. Thereafter, a treatment process is performed to transform the rest of the deposited conductive material (e.g., the portions that have not been transformed into the silicide material) into a barrier material, for example, titanium nitride (TiN).

Figure 12:
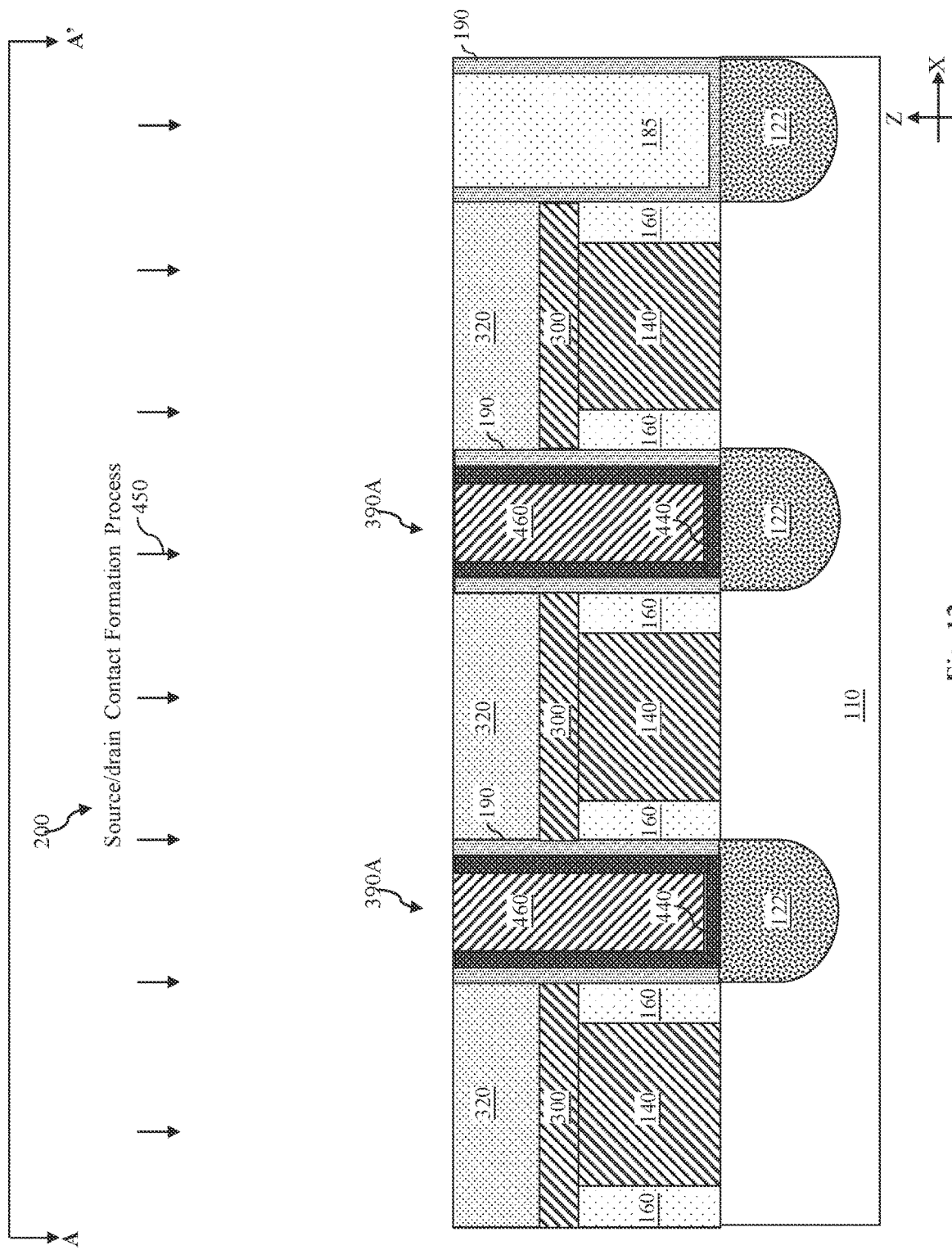

Referring now to FIG. 12, a source/drain contact formation process 450 is performed to the IC device 200 to form source/drain contacts 460 in the source/drain contact openings 390A and over the silicide layers 440. She source/drain contact formation process 450 may include a deposition process to deposit a metal-containing material (e.g., cobalt) into the source/drain contact openings 390A. The source/drain contacts 460 provide electrical connectivity to the source/drain components 122. The barrier material formed by the treatment process discussed above may help prevent metal diffusion from the source/drain contacts 460 into the source/drain components 122 and/or into other components of the IC device 200. The source/drain contact formation process 450 may also include a polishing process (e.g., a CMP process) to grind away and polish excess portions of the deposited metal-containing material as well as other layers outside of the source/drain contact holes 390A, until the upper surfaces of the mask layer 320, the source/drain contacts 460, and the dielectric layer 190 are substantially co-planar with one another.

Figure 13:
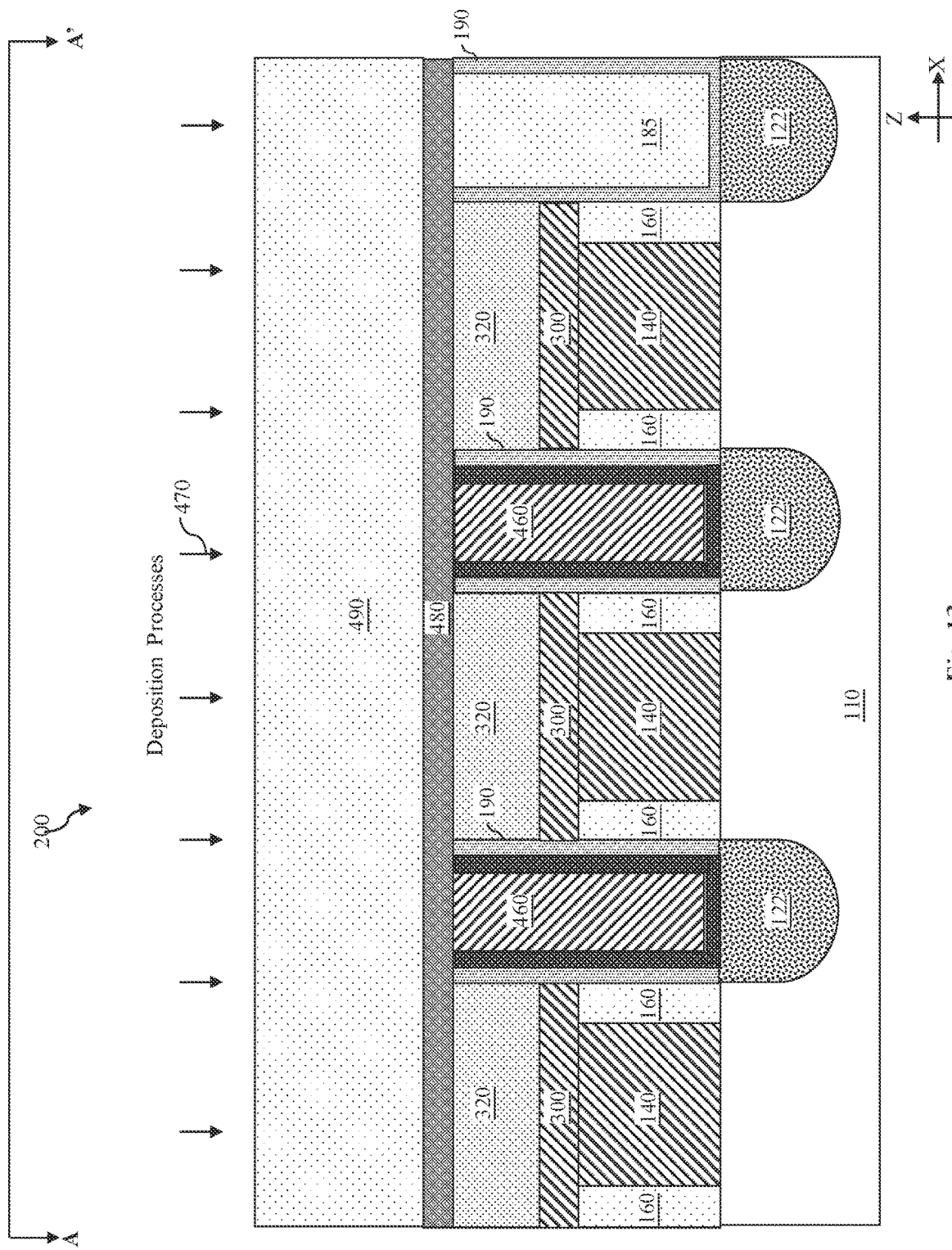

Referring now to FIG. 13, a plurality of deposition processes 470 are performed to the IC device 200 to form an etching-stop layer 480 over the planarized upper surfaces of the mask layer 320, the source/drain contacts 460, and the dielectric layer 190, and to also form an ILD 490 over the etching-stop layer 480. In some embodiments, the deposition processes 470 may include CVD processes, PVD processes, ALD processes, or combinations thereof. In some embodiments, the etching-stop layer 480 may include a dielectric material such as silicon oxide, silicon nitride, silicon oxynitride, silicon carbide, etc. In some embodiments, the ILD 490 and the ILD 185 may have substantially similar (or identical) material compositions.

Figure 14:
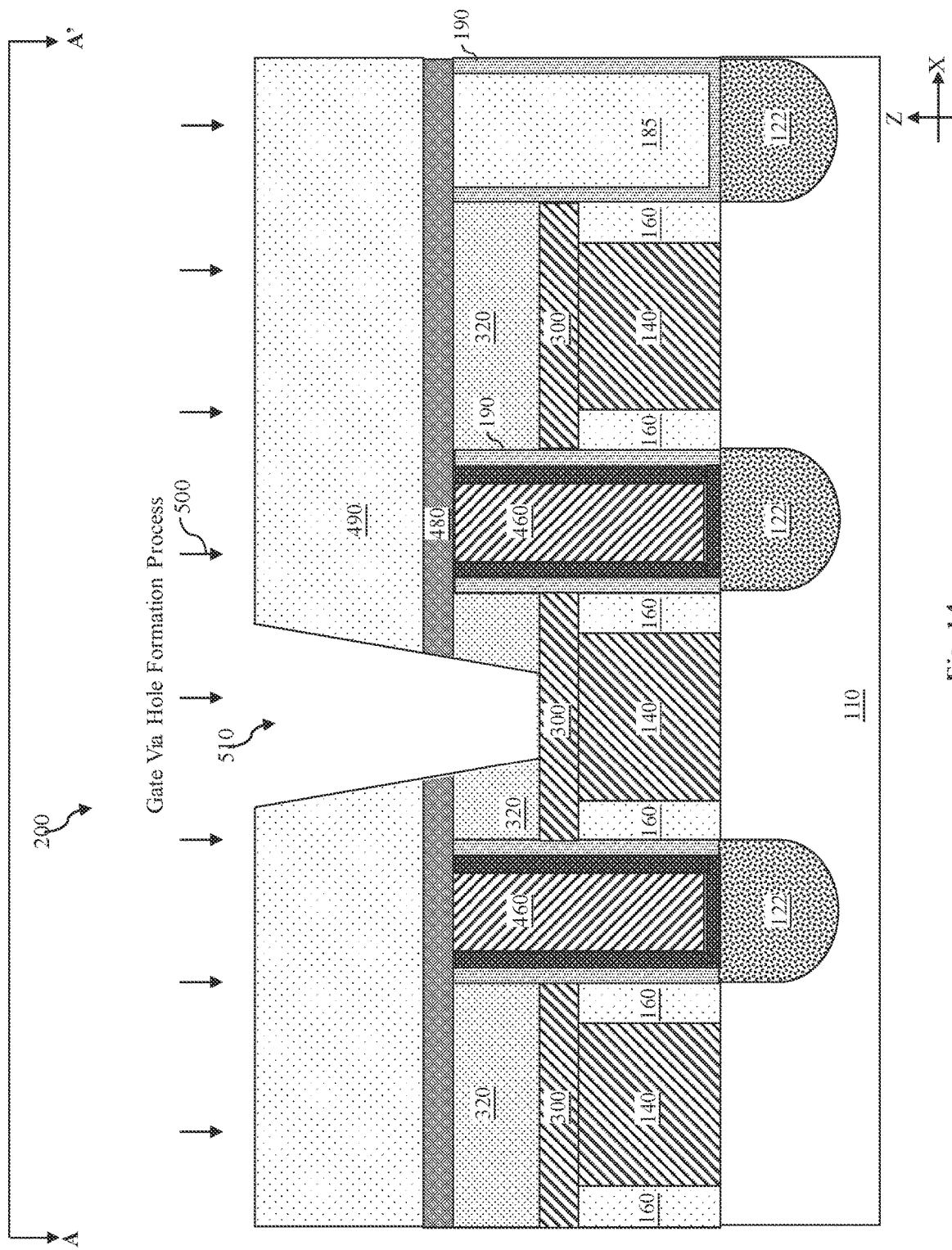

Referring now to FIG. 14, a gate via hole formation process 500 is performed to the IC device 200 to form a gate via hole 510. The gate via hole formation process 500 may include one or more etching processes, such as wet etching processes or dry etching processes. The etching processes partially remove portions of the ILD 490, the etching-stop layer 480, and the mask layer 320 disposed over the middle HKMG structure 140 shown in FIG. 14 to form an opening therein as the gate via hole 510. The gate via hole 510 exposes an upper surface of a portion of the capping layer 300.

Figure 15:
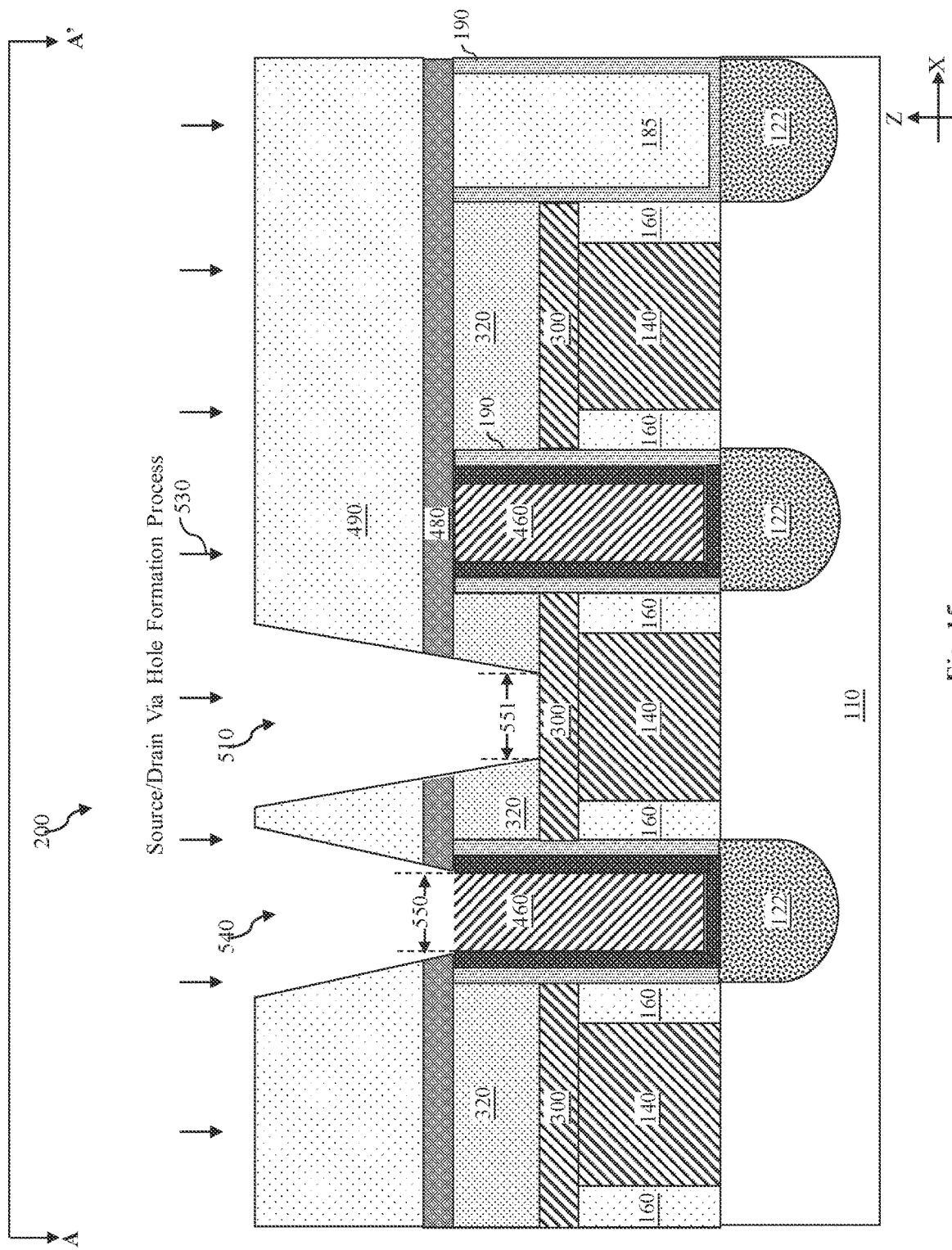

Referring now to FIG. 15, a source/drain via hole formation process 530 is performed to the IC device 200 to form a source/drain via hole 540. The source/drain via hole formation process 530 may include one or more etching processes, such as wet etching processes or dry etching processes. The etching processes partially remove portions of the ILD 490 and the etching-stop layer 480 disposed over the left source/drain contact 460 shown in FIG. 14 to form an opening therein as the source/drain via hole 540. The source/drain via hole 540 exposes an upper surface of a portion of the left source/drain contact 460 shown in FIG. 15.

As shown in FIG. 15, a bottommost portion of the source/drain via hole 540 has a lateral dimension 550 (measured in the X-direction), and a bottommost portion of the gate via hole 510 has a lateral dimension 551 (measured in the X-direction). The lateral dimensions 550 and 551 represent the narrowest parts of the source/drain via hole 540 and the gate via hole 510, respectively. They may also be referred to as the critical dimension (CD) of the source/drain via hole 540 and the gate via hole 510, respectively.

As semiconductor fabrication technologies progress to ever-smaller technology nodes (e.g., 5-nanometer node or smaller), the lateral dimensions 550 and/or 551 also shrink. In some embodiments, the lateral dimensions 550 and 551 may be in a range between about 9.5 nanometers and about 14 nanometers. Such a small dimension of the source/drain via hole 540 and/or the gate via hole 510 may make them difficult to fill (in the process of forming vias) without trapping gaps or voids therein, which could degrade the performance of the IC device. As a conductive material that is otherwise suitable for serving as vias, copper has low resistivity but also poor gap filling performance. Hence, conventional approaches of forming the source/drain and gate vias in advanced technology nodes may opt to deposit a non-copper material that has good gap filling performance, even if such a material of the via has a greater resistivity than copper. As such, conventional approaches of fabricating vias in the advanced technology nodes have not been optimized in terms of electrical performance, since the resulting source/drain and/or gate vias may have higher-than-desired resistivity, which could lead to slower device speed, excessive power consumption, etc. The present disclosure solves this problem by forming liners in the source/drain via hole 540 and in the gate via hole 510, which allows a copper-containing material to be deposited therein to form the source/drain via and gate via without trapping gaps or voids therein, while still offering the low resistivity and therefore improved electrical performance associated with copper-containing vias, as discussed below in more detail.

Figure 16:
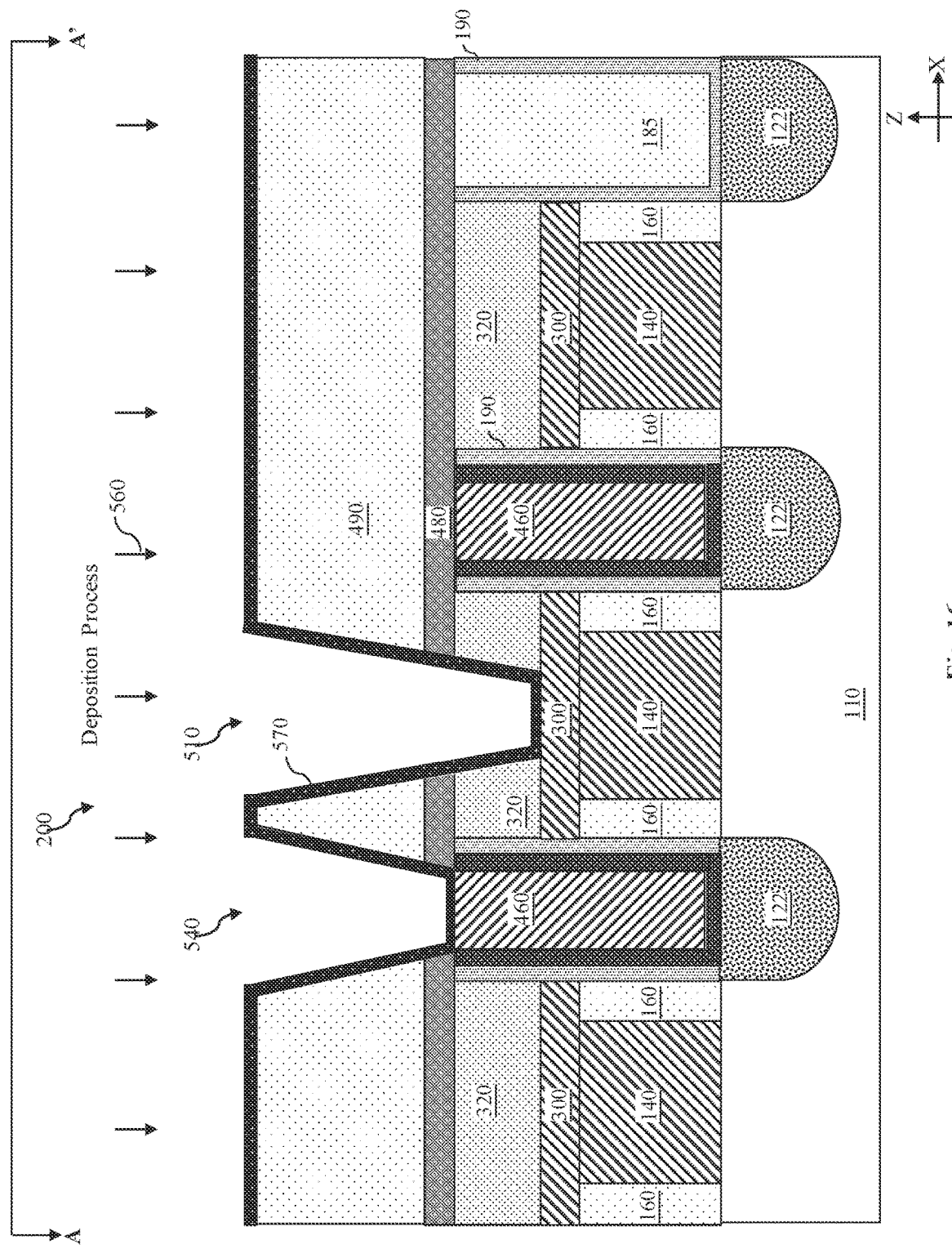

Referring now to FIG. 16, a deposition process 560 is performed to the IC device 200 to form a liner layer 570. In some embodiments, the deposition process 560 includes an ALD process (e.g., a plasma-enhanced ALD process) to deposit the liner layer 570 into the gate via hole 510 and the source/drain via hole 540. As shown in FIG. 16, the liner layer 570 covers the upper surfaces of the source/drain contact 460 and the capping layer 300, as well as the side surfaces of the etching-stop layer 480 and the ILD 490.

In some embodiments, the deposition process 560 deposits tantalum nitride (TaN) or titanium nitride (TiN) as the material for the liner layer 570. Such a material composition of the liner layer 570 helps it serve as a barrier layer. For example, as will be discussed below, a conductive gate via and a conductive source/drain via will be formed in the gate via hole 510 and in the source/drain via hole 540 to provide electrical connectivity to the HKMG structure 140 and the source/drain component 122, respectively. Without a barrier layer, the conductive material of the gate via and/or the source/drain via may diffuse into adjacent components, which may be undesirable. Here, the liner layer 570 prevents such an undesirable diffusion of materials from the gate via and/or the source/drain via.

Figure 17:
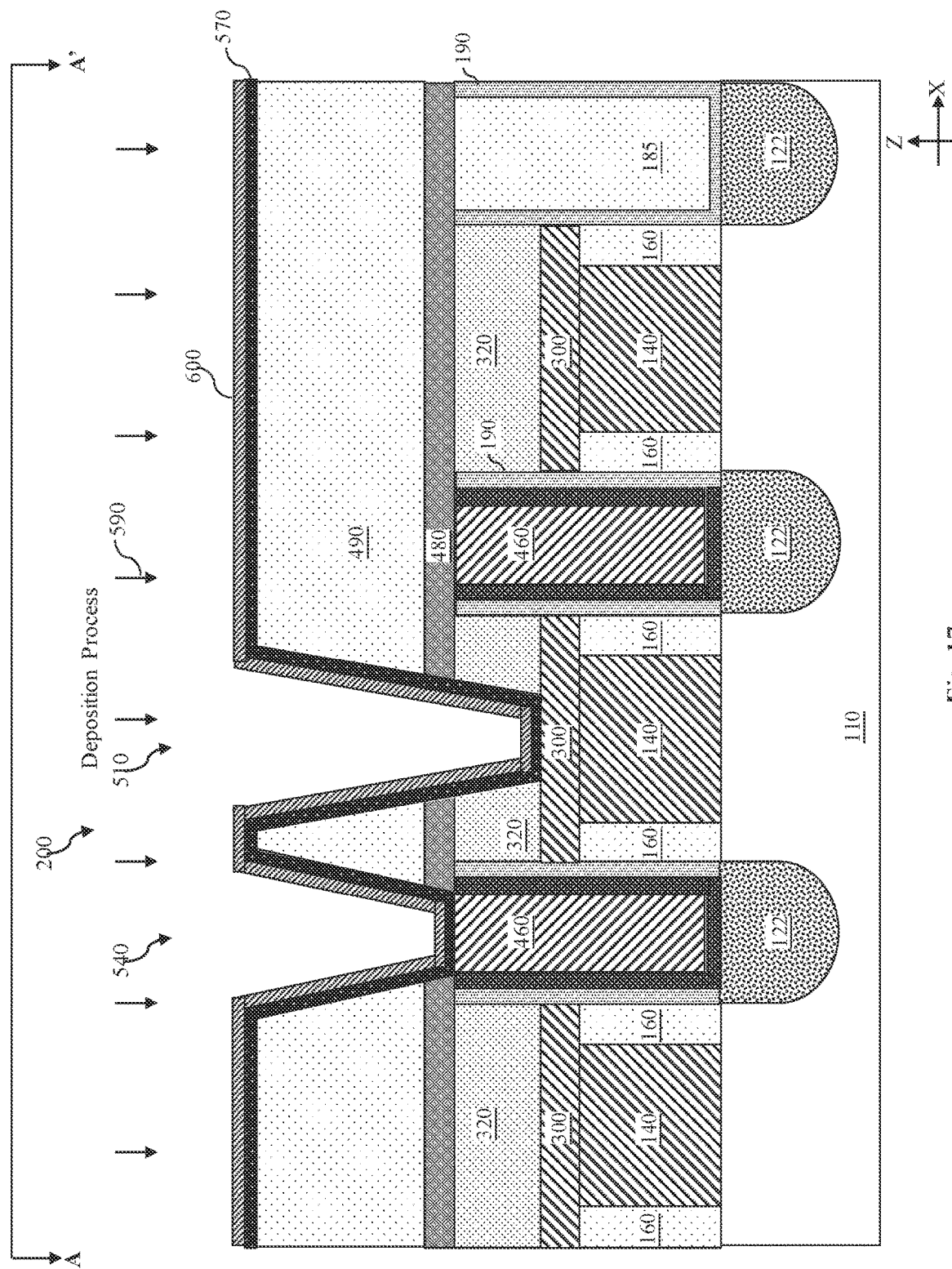

Referring now to FIG. 17, a deposition process 590 is performed to the IC device 200 to form a liner layer 600. In some embodiments, the deposition process 590 includes an ALD process (e.g., a plasma-enhanced ALD process) to deposit the liner layer 600 onto the liner layer 570 and into the gate via hole 510 and the source/drain via hole 540. In some embodiments, the deposition process 590 deposits a ruthenium (Ru), tungsten (W), cobalt (Co), or combinations thereof as the material as the material for the liner layer 600. Such a material composition of the liner 600 helps it serve as a wetting layer to facilitate a reflow of a conductive material (e.g., copper) that is deposited over the liner 600 in a subsequent process to form source/drain vias and gate vias. Conventional fabrication processes lack such a liner layer 600 as a wetting layer, which limits the choices of materials that can be used to implement the source/drain vias and gate vias in advanced technology nodes (e.g., 5-nanometer or below) where the critical dimensions of vias are small.

In some embodiments, the liner layer 570 is formed to have a thickness in a range between about 10 angstroms to about 20 angstroms, and the liner layer 600 is formed to have a thickness in a range between about 10 angstroms to about 15 angstroms. These thickness ranges are not randomly chosen but specifically configured herein to optimize device performance. For example, if the liner layer 570 is too thin, it may not adequately serve its function as a barrier layer to prevent the diffusion of the copper-containing material out of the source/drain via and the gate via. On the other hand, if the liner layer 570 is too thick, it may further reduce the critical dimensions of the source/drain via hole 540 and the gate via hole 510, which makes them even harder to fill. As another example, if the liner layer 600 is too thin, it may not adequately serve its function as a wetting layer to facilitate the deposition of the copper-containing material into the source/drain via hole 540 and the gate via hole 510. On the other hand, if the liner layer 600 is too thick, it may also needlessly reduce the critical dimensions of the source/drain via hole 540 and the gate via hole 510, which makes them even harder to fill.

Figure 18:
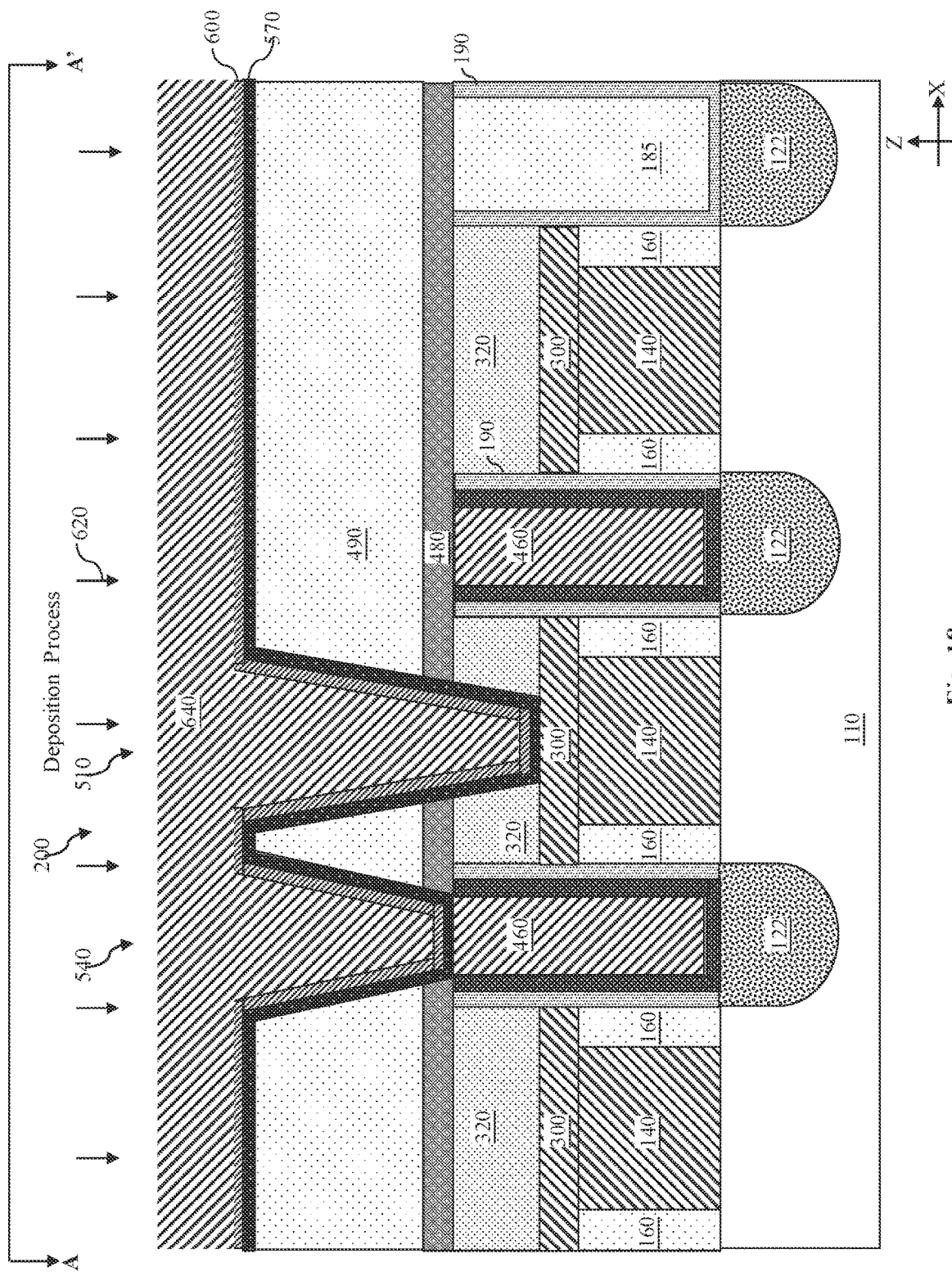

Referring now to FIG. 18, a deposition process 620 is performed to the IC device 200 to deposit a copper-containing material 640 on the liner layer 600. In some embodiments, the deposition process 620 includes a PVD process, in which copper manganese (CuMn) is used as a target. In some embodiments, the PVD process is performed at a process temperature in a range between about 300 degrees Celsius and about 400 degrees Celsius. A thermal baking process is then performed to the IC Device 200 to cause the deposited copper-containing material 640 to reflow. In some embodiments, the thermal baking process is performed after the PVD process. In other embodiments, the thermal baking process is performed as a part of the PVD process. In some embodiments, the thermal baking process is performed for a process duration in a range between about 4 minutes and about 10 minutes. These process parameters are specifically configured to cause a sufficient amount of reflow of the deposited copper-containing material, while minimizing risks of damaging the IC device.

As discussed above, the liner layer 600 facilitates the reflow of the copper-containing material 640 because the ruthenium/cobalt/tungsten material composition of the liner layer 600 has a lower wetting angle (compared to other materials), and that allows the copper-containing material 640 to be deposited while avoiding agglomeration. The lack of agglomeration of the copper-containing material 640 means that it can fill the source/drain via hole 540 and the gate via hole 510 more effectively or more easily without trapping gaps or voids therein, even when the critical dimension (e.g., the lateral dimension 550 or 551) of these via holes are very small. As such, the implementation of the liner layer 600—which is a unique aspect of the present disclosure—allows the copper-containing material such as CuMn to be formed as conductive source/drain vias and gate vias. In addition, the liner layer 570 prevents the extrusion of copper from the copper-containing material 640 into nearby components, such as into the HKMG structure 140.

Figure 19:
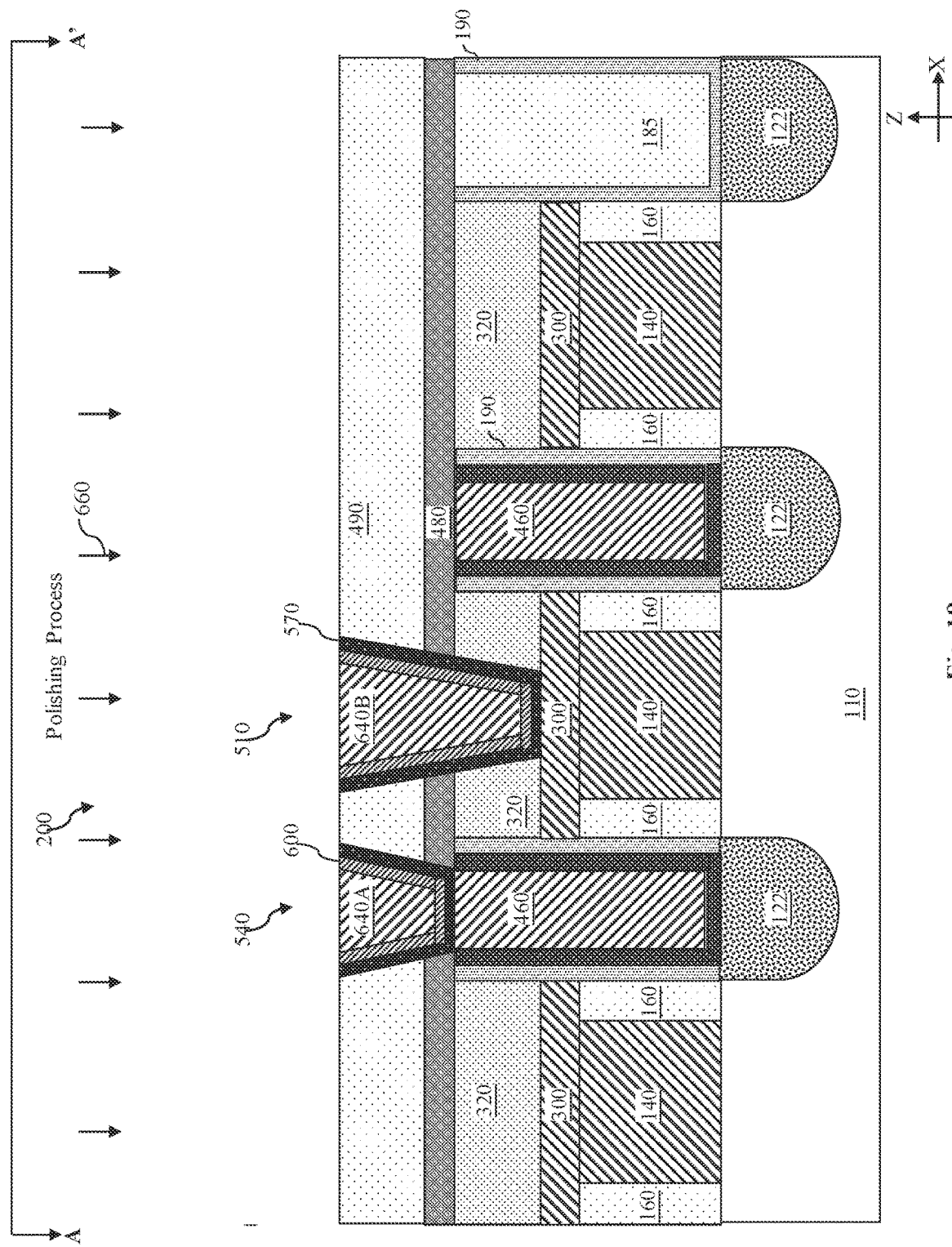
Figure 20:
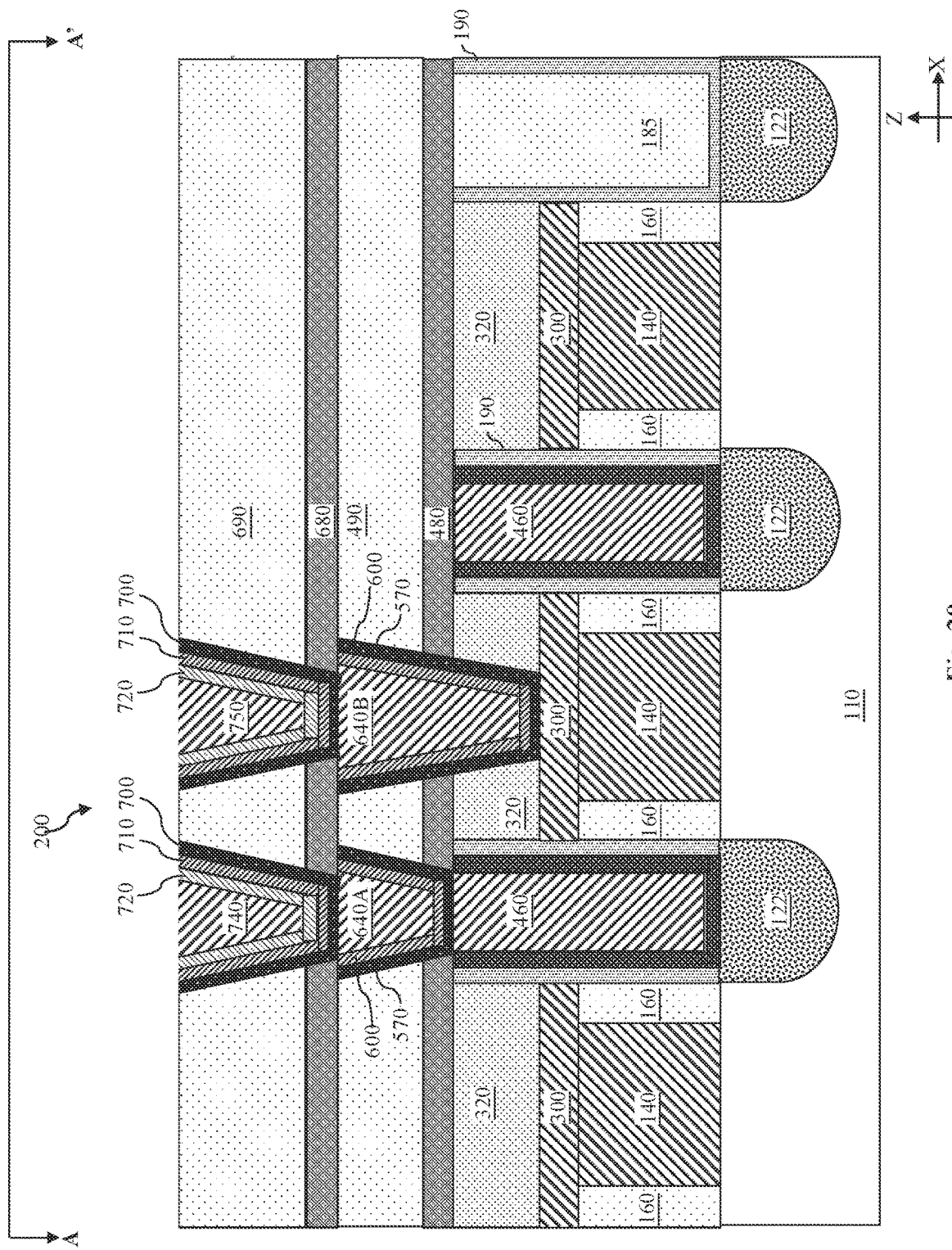

Referring now to FIG. 19, a polishing process 660, such as a CMP process, is performed to the IC device 200 to grind away and polish excess portions of the deposited copper-containing material 640 outside the source/drain via hole 540 and the gate via hole 510. The polishing process also reduces the height of the portions of the copper-containing material 640 filling the via holes, as well as the height of the ILD 490, the liner layers 570 and 600. After the performance of the polishing process 660, a source/drain via 640A and a gate via 640B are formed. Due to the implementation of the liner layer 600, the source/drain via 640A and the gate via 640B are formed without containing air gaps or voids therein, even though their critical dimensions are small. Furthermore, the fact that the source/drain via 640A and the gate via 640B have a copper-containing material composition (e.g., containing mostly copper but also manganese) means that they have low resistivity, and thus the source/drain or gate contact resistance of the IC device 200 is also reduced. Hence, the present disclosure simultaneously improves gap filling performance and electrical resistance reduction. In some embodiments, a content of the Mn in the source/drain 640A or the gate via 640B is in a range between about 0.5% and about 1%.

Additional components of a multi-layer interconnect structure may be formed over the source/drain via 640A and the gate via 640B to complete the fabrication of the IC device 200. For example, referring now to FIG. 20, a bottom layer of such a multi-layer interconnect structure is illustrated. The bottom layer includes an etching-stop layer 680 that is formed over the ILD 490 and over the source/drain via 640A and the gate via 640B, as well as an ILD 690 formed over the etching-stop layer 680. In some embodiments, the etching-stop layer 680 and the etching-stop layer 480 may have substantially similar material compositions, and the ILD 690 and the ILD 490 may have substantially similar material compositions.

Metal line trenches may be etched vertically through the ILD 690 and the etching-stop layer 680, and liner layers 700, 710, 720 may be formed in these metal line trenches. In that regard, the liner layer 700 may contain TaN or TiN and may be formed using processes similar to those used to form the liner layer 570. Thus, the liner layer 700 may serve as a barrier layer, similar to the liner layer 570. The liner layer 710 may contain Ru, Co, or W, and it may be formed using processes similar to those used to form the liner layer 600. Thus, the liner layer 710 may serve as a wetting layer, similar to the liner layer 600. The liner layer 720 may be formed using an ALD or PEALD process, and it may contain Co. The liner layer 720 may also serve as an etching-stop layer for a metal-zero (M0) interconnect layer of a multi-layer interconnect structure.

A metal line 740 is formed over the source/drain via 640A, and a metal line 750 is formed over the gate via 640B. The metal lines 740 and 750 each extend in an elongated manner in the Y-direction (i.e., orthogonal to the plane defined by the Z-direction and X-direction). In the cross-sectional view of FIG. 20, it can be seen that the metal line 740 is wrapped around by the liner layers 700-720 and is electrically coupled to the source/drain via 640A, and the metal line 750 is wrapped around by the liner layers 700-720 and is electrically coupled to the gate via 640B. The metal lines 740 and 750 contain a conductive material such as copper and provide electrical connectivity to the source/drain component 122 and the HKMG structure 140, respectively.

It is understood that the IC device 200 discussed above may be implemented in a variety of IC applications, including memory devices such as Static Random-Access Memory (SRAM) devices. In that regard, FIG. 21 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 22 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the deposition processes 560, 590, or 620 discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 23 is a flowchart illustrating a method 1000 of fabricating a semiconductor device. The method 1000 includes a step 1010 to form a mask layer over a gate structure of a transistor. The transistor may be a FinFET transistor or a GAA transistor.

The method 1000 includes a step 1020 to form an interlayer dielectric (ILD) layer over the mask layer.

The method 1000 includes a step 1030 to etch an opening over the gate structure. The opening vertically extends through the ILD layer and the mask layer. In some embodiments, the etching the opening includes etching a gate via opening.

The method 1000 includes a step 1040 to deposit one or more liner layers within the opening. In some embodiments, the step 1040 includes depositing a bottom liner layer in the opening, wherein the bottom liner layer contains tantalum nitride or titanium nitride. In some embodiments, the step 1040 further includes depositing an upper liner layer on the bottom liner layer, wherein the upper liner layer contains ruthenium, cobalt, or tungsten, and wherein the copper-containing material is formed on the upper liner layer.

The method 1000 includes a step 1050 to fill the opening with a copper-containing material. In some embodiments, the step 1050 includes performing a physical vapor deposition (PVD) process with CuMn as a target. In some embodiments, the PVD process is performed with a process temperature in a range between about 300 degrees Celsius and about 400 degrees Celsius.

The method 1000 includes a step 1060 to cause the copper-containing material to reflow in the opening at least in part by performing a baking process. In some embodiments, the baking process is performed for a duration in a range between about 4 minutes and about 10 minutes.

It is understood that additional steps may be performed before, during, or after the steps 1010-1060. For example, the method 1000 may include a step of: before the forming of the mask layer, forming a capping layer on an upper surface of the gate structure. The capping layer contains tungsten. As another example, the method 1000 may include a step of etching a source/drain via opening over a source/drain contact. The source/drain via opening vertically extends through the ILD layer. In some embodiments, one or more liner layers are deposited within both the gate via opening and the source/drain via opening. In some embodiments, both the gate via opening and the source/drain via opening are filled with the copper-containing material. The method 1000 may also include the formation of other metal lines and vias of a multi-layer interconnect structure. For reasons of simplicity, these additional steps are not discussed in detail herein.

In summary, the present disclosure involves forming liner layers in gate via holes and/or source/drain via holes in advanced technology nodes where the via holes have small dimensions (e.g., with a width between about 9.5 nm and about 14 nm). The liner layers may include a liner layer that contains TaN or TiN, as well as a liner layer that contains Ru, Co, or W. The present disclosure also involves forming a capping layer between the gate structure and the gate contact. The capping layer may include a tungsten capping layer.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improved performance of IC devices. For example, as device sizes are scaled down in newer technology generations, via holes with small dimensions are becoming harder to fill. Conductive materials (e.g., non-copper materials) that have good gap filling performance may not have low resistivity, and conductive materials (e.g., copper-containing materials) may have low resistivity but poor gap filling characteristics. Here, the implementation of the liner layers in the via holes enhance the reflow of a copper-containing material (e.g., CuMn) deposited in the via holes, for example, by reducing or preventing agglomeration of the deposited copper-containing material. As a result, the copper-containing material can be deposited in narrow openings (i.e., the via holes) without trapping gaps or voids therein. The copper-containing material also has reduced resistance, which translates into faster device speed and/or lower power consumption, etc. The liner layers may also prevent diffusion of the copper-containing material outside of the vias. Furthermore, the capping layer formed on the gate structure prevents the copper deposited into the gate via from leaking into the gate structure, which would have interfered with the threshold voltage of the gate and therefore degraded the performance of the transistor. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a semiconductor device. The semiconductor device includes a source/drain component of a transistor. A source/drain contact is disposed over the source/drain component. A source/drain via is disposed over the source/drain contact. The source/drain via contains copper. A first liner at least partially surrounds the source/drain via. A second liner at least partially surrounds the first liner. The first liner and the second liner are disposed between the source/drain contact and the source/drain via. The first liner and the second liner have different material compositions.

Another aspect of the present disclosure pertains to a semiconductor device. The semiconductor device includes a gate structure of a transistor. A gate via is disposed over an upper surface of the gate structure. The gate via contains copper and manganese. A bottom surface and side surfaces of the gate via are surrounded by one or more liner layers. A capping layer is disposed between the gate structure and the gate via. A material composition of the capping layer is configured such that the capping layer prevents a penetration of the copper or the manganese of the gate via into the gate structure.

Another aspect of the present disclosure pertains to a method of fabricating a semiconductor device. A mask layer is formed over a gate structure of a transistor. An interlayer dielectric (ILD) layer is formed over the mask layer. An opening is etched over the gate structure. The opening vertically extends through the ILD layer and the mask layer. One or more liner layers are deposited within the opening. After the one or more liner layers have been deposited within the opening, the opening is filled with a copper-containing material. The copper-containing material reflows in the opening at least in part by performing a baking process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
   a source/drain component of a transistor;
   a gate structure of the transistor disposed adjacent to the source/drain component, wherein the gate structure includes both a gate dielectric and a gate electrode;
   a source/drain contact disposed over the source/drain component, wherein an uppermost surface of the source contact has a greater vertical elevation than an uppermost surface of the gate structure;
   a silicide layer disposed on a bottom surface and side surfaces of the source/drain contact in a cross-sectional side view;
   a source/drain via disposed over the source/drain contact, wherein the source/drain via contains copper;
   a first liner that at least partially surrounds the source/drain via;
   a second liner that at least partially surrounds the first liner, wherein the first liner and the second liner are disposed between the source/drain contact and the source/drain via, and wherein the first liner and the second liner have different material compositions; and
   a dielectric component disposed adjacent to the source/drain contact and over the source/drain component, wherein the silicide layer is disposed between the dielectric component and the source/drain contact, wherein a maximum vertical dimension of the dielectric component is substantially similar to a maximum vertical dimension of the silicide layer, and wherein a bottom surface of the dielectric component is disposed closer to an upper surface of the source/drain component than a bottom surface of the source/drain contact.

2. The semiconductor device of claim 1, further comprising: an etching-stop layer (ESL) disposed over the source/drain contact; and
   an interlayer dielectric (ILD) disposed over the ESL, wherein a side surface of the second liner extends to both the ESL and the ILD.

3. The semiconductor device of claim 1, wherein:
   the first liner extends to the source/drain via;
   the second liner extends to the source/drain contact;
   the source/drain via further contains manganese;
   the first liner contains ruthenium, cobalt, or tungsten; and
   the second liner contains tantalum nitride or titanium nitride.

4. The semiconductor device of claim 1, further comprising a gate spacer disposed on a side surface of the gate structure, wherein a top surface of the dielectric component is located higher than a top surface of the gate spacer.

5. The semiconductor device of claim 1, wherein:
   the first liner has a first thickness in a range between about 10 angstroms and about 15 angstroms; and
   the second liner has a second thickness in a range between about 10 angstroms and about 20 angstroms.

6. The semiconductor device of claim 1, wherein the gate structure includes both a gate dielectric and a gate electrode, and wherein the semiconductor device further includes:
   a gate via disposed over the gate electrode, wherein the gate via contains copper;
   a third liner that at least partially surrounds the gate via; and
   a fourth liner that at least partially surrounds the third liner, wherein the third liner and the fourth liner are disposed between the gate structure and the gate via, and wherein the third liner and the fourth liner have different material compositions.

7. The semiconductor device of claim 6, wherein:
   the third liner and the first liner have same material compositions; and
   the fourth liner and the second liner have same material compositions.

8. The semiconductor device of claim 6, further comprising a capping layer disposed between the gate structure and the gate via, wherein the capping layer contains tungsten, and wherein the capping layer is wider than the gate structure and has a substantially flat bottom surface in a cross-sectional side view.

9. A semiconductor device, comprising:
   a gate structure of a transistor;
   gate spacers disposed on side surfaces of the gate structure;
   a gate via disposed over an upper surface of the gate structure, wherein the gate via contains copper and manganese, and wherein a bottom surface and side surfaces of the gate via are surrounded by one or more liner layers; and
   a capping layer disposed between the gate structure and the gate via, wherein a material composition of the capping layer is configured such that the capping layer prevents a penetration of the copper or the manganese of the gate via into the gate structure, wherein a lateral dimension of the capping layer exceeds a maximum lateral dimension of the gate structure in a cross-sectional side view, and wherein a first portion of the capping layer located directly over the gate spacers and a second portion of the capping layer located directly over the gate structure have substantially co-planar bottom surfaces.

10. The semiconductor device of claim 9, wherein the gate structure includes both a gate dielectric and a gate electrode, and wherein the capping layer contains fluorine-free tungsten.

11. The semiconductor device of claim 9, wherein:
    the one or more liner layers include a first liner layer and a second liner layer having a different material composition than the first liner layer;
    an inside surface of the first liner layer is in direct contact with the bottom surface and the side surfaces of the gate via;

an inside surface of the second liner layer is in direct contact with an outside surface of the first liner layer; and an outside surface of the second liner layer is in direct contact with an upper surface of the capping layer.

12. The semiconductor device of claim 11, wherein:

the first liner layer contains ruthenium, cobalt, or tungsten;

the first liner layer has a first thickness in a range between about 10 angstroms and about 15 angstroms;

the second liner layer contains tantalum nitride or titanium nitride; and the second liner layer has a second thickness in a range between about 10 angstroms and about 20 angstroms.

13. The semiconductor device of claim 9, wherein the one or more liner layers include one or more gate via liner layers, and wherein the semiconductor device further comprises:

a source/drain component of the transistor disposed adjacent to the gate structure;

a source/drain contact disposed over the source/drain component; and a source/drain via disposed over the source/drain contact, wherein the source/drain via contains copper and manganese, wherein a bottom surface and side surfaces of the source/drain via are surrounded by one or more source/drain via liner layers.

14. The semiconductor device of claim 13, wherein the one or more gate via liner layers contain similar materials as the one or more source/drain via liner layers.

15. A semiconductor device, comprising:

an epi-layer;

a conductive contact formed over the epi-layer;

a conductive via formed over the conductive contact;

a first liner that at least partially surrounds, and is in direct contact with, the conductive via, wherein the first liner has a first material composition;

a second liner that at least partially surrounds the first liner, wherein the second liner is in direct contact with the conductive contact, and wherein the second liner has a second material composition different from the first material composition;

a silicide layer that surrounds a bottom surface and side surfaces of the conductive contact in a cross-sectional side view; and a dielectric layer disposed over the epi-layer, wherein the silicide layer is disposed between the dielectric layer and the conductive contact, wherein the dielectric layer has a substantially similar vertical dimension as a combination of the silicide layer and the conductive contact.

16. The semiconductor device of claim 15, wherein the first liner and the second liner are disposed laterally between the conductive contact and the conductive via in the cross-sectional side view.

17. The semiconductor device of claim 15, wherein:

the conductive via contains copper and manganese;

the first material composition includes ruthenium, cobalt, or tungsten; and the second material composition includes tantalum nitride or titanium nitride.

18. The semiconductor device of claim 15, further comprising a gate structure formed adjacent to the epi-layer in the cross-sectional side view, wherein a top surface of the silicide layer is located higher than a top surface of the gate structure.

19. The semiconductor device of claim 15, wherein the epi-layer is a source/drain component of a transistor, and wherein the semiconductor device further includes:

a gate structure formed adjacent to the source/drain component in the cross-sectional side view;

a gate via formed over the gate structure in the cross-sectional side view, wherein the gate via contains copper;

a third liner that at least partially surrounds the gate via in the cross-sectional side view; and a fourth liner that at least partially surrounds the third liner in the cross-sectional side view, wherein the third liner and the fourth liner are disposed between the gate structure and the gate via in the cross-sectional side view, wherein the third liner has the first material composition, and wherein the fourth liner has the second material composition.

20. The semiconductor device of claim 19, wherein the gate structure includes both a gate dielectric and a gate electrode, and wherein the semiconductor device further comprises a capping layer formed between the gate structure and the gate via in the cross-sectional side view, wherein the capping layer contains tungsten, and wherein the capping layer is wider than the gate structure in the cross-sectional side view.

* * * * *